(12) United States Patent
Kim et al.

(10) Patent No.: US 9,373,703 B2
(45) Date of Patent: Jun. 21, 2016

(54) SEMICONDUCTOR DEVICE AND METHOD OF MANUFACTURING THE SAME

(71) Applicant: Samsung Electronics Co., Ltd., Suwon-si (KR)

(72) Inventors: JinBum Kim, Seoul (KR); Jungho Yoo, Seongnam-si (KR); Byeongchan Lee, Yongin-si (KR); Choeun Lee, Pocheon-si (KR); Hyun Jung Lee, Suwon-si (KR); Seong Hoon Jeong, Seongnam-si (KR); Bonyoung Koo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/499,922

(22) Filed: Sep. 29, 2014

(65) Prior Publication Data
US 2015/0206956 A1    Jul. 23, 2015

(30) Foreign Application Priority Data
Jan. 21, 2014    (KR) .................. 10-2014-0007353

(51) Int. Cl.
*H01L 29/66* (2006.01)
*H01L 21/8234* (2006.01)
*H01L 29/165* (2006.01)

(52) U.S. Cl.
CPC .. *H01L 29/66795* (2013.01); *H01L 21/823431* (2013.01); *H01L 21/823456* (2013.01); *H01L 21/823481* (2013.01); *H01L 29/165* (2013.01); *H01L 29/6656* (2013.01); *H01L 29/66545* (2013.01)

(58) Field of Classification Search
CPC .............. H01L 21/02381; H01L 21/02433; H01L 21/02532; H01L 21/0262; H01L 21/02639; H01L 21/02647; H01L 21/823431; H01L 21/823807; H01L 21/84; H01L 27/1203; H01L 27/1207; H01L 29/66545; H01L 29/66795
USPC .............. 257/E27.112, E21.131, E21.409, 257/E21.633, E21.703, 190, 288, 347; 438/158, 222, 294, 387, 478, 481
See application file for complete search history.

(56) References Cited

U.S. PATENT DOCUMENTS

| | | | |
|---|---|---|---|
| 7,705,345 B2 | 4/2010 | Bedell et al. | |
| 8,765,546 B1* | 7/2014 | Hung | H01L 21/823431 257/190 |
| 2005/0277260 A1* | 12/2005 | Cohen | H01L 21/84 438/387 |
| 2007/0298558 A1* | 12/2007 | Yamauchi | H01L 21/26513 438/197 |
| 2013/0200454 A1* | 8/2013 | Anderson | H01L 29/66545 257/347 |
| 2014/0361373 A1* | 12/2014 | Hung | H01L 29/7848 257/365 |

* cited by examiner

*Primary Examiner* — Stephen W Smoot
*Assistant Examiner* — Edward Chin
(74) *Attorney, Agent, or Firm* — Muir Patent Law, PLLC

(57) ABSTRACT

A method of manufacturing a semiconductor device includes forming an active pattern protruding from a semiconductor substrate, forming a dummy gate pattern crossing over the active pattern, forming gate spacers on opposite first and second sidewalls of the dummy gate pattern, removing the dummy gate pattern to form a gate region exposing an upper surface and sidewalls of the active pattern between the gate spacers, recessing the upper surface of the active pattern exposed by the gate region to form a channel recess region, forming a channel pattern in the channel recess region by a selective epitaxial growth (SEG) process, and sequentially forming a gate dielectric layer and a gate electrode covering an upper surface and sidewalls of the channel pattern in the gate region. The channel pattern has a lattice constant different from that of the semiconductor substrate.

20 Claims, 36 Drawing Sheets

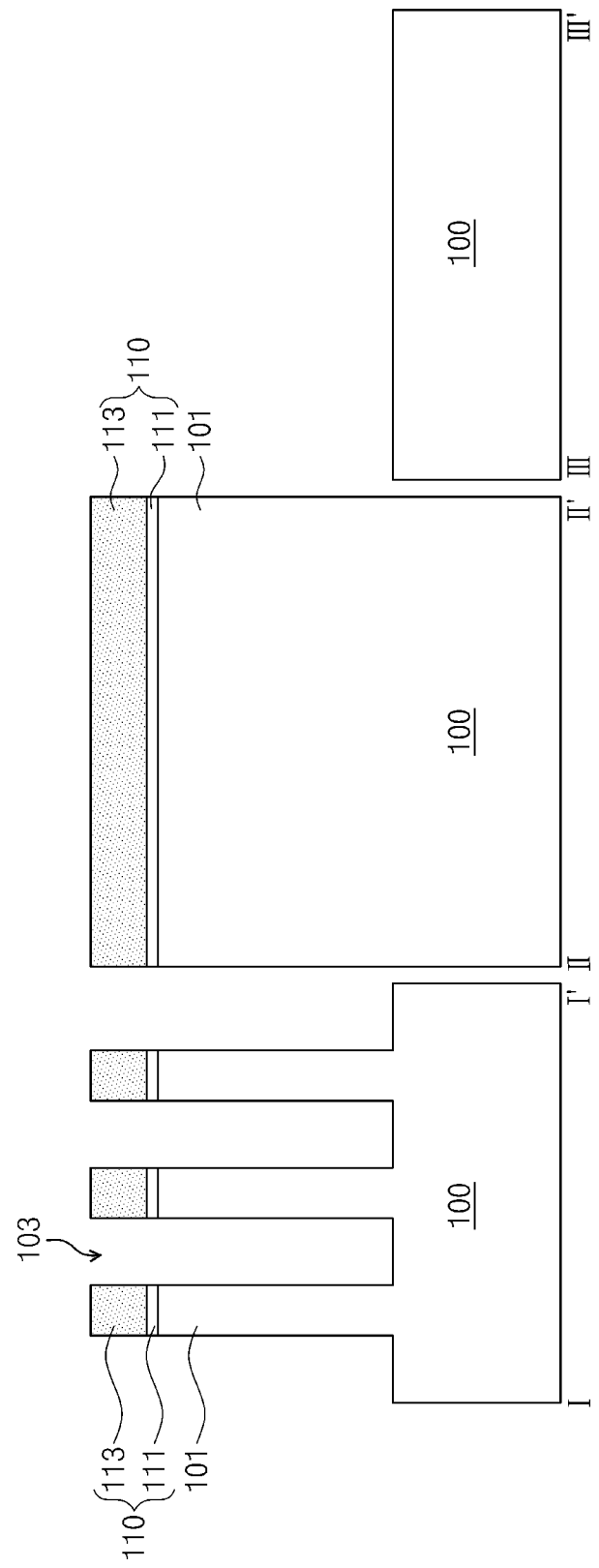

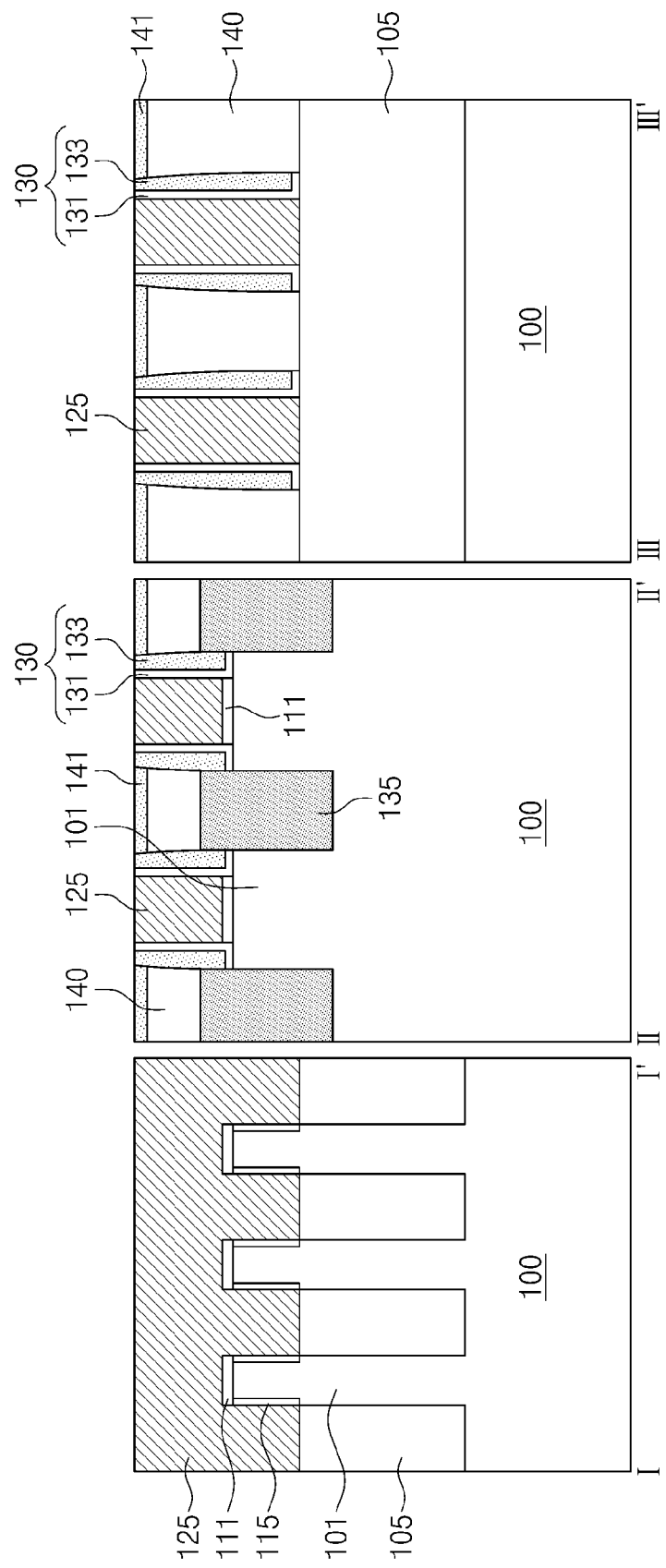

ND METHOD
SEMICONDUCTOR DEVICE AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2014-0007353, filed on Jan. 21, 2014, in the Korean Intellectual Property Office, the disclosure of which is hereby incorporated by reference in its entirety.

BACKGROUND

1. Technical Field

The present disclosure herein relates to semiconductor devices and methods of manufacturing the same and, more particularly, to fin field effect transistors and methods of manufacturing the same.

2. Description of Related Art

Certain semiconductor devices include integrated circuits having metal-oxide-semiconductor (MOS) field effect transistors (FET). As semiconductor devices have been highly integrated, sizes of MOS field effect transistors have been increasingly reduced, which can deteriorate operating characteristics of the semiconductor devices. Thus, various research is being conducted for semiconductor devices capable of overcoming limitations caused by high integration of the semiconductor devices and of improving performance of the semiconductor devices. Particularly, research is being conducted for high performance MOS field effect transistors capable of increasing mobility of electrons and holes.

SUMMARY

Embodiments of the inventive concepts may provide semiconductor devices capable of improving electrical characteristics.

Embodiments of the inventive concepts may also provide methods of manufacturing a semiconductor device with improved electrical characteristics.

In one aspect, a method of manufacturing a semiconductor device may include: forming an active pattern protruding from a semiconductor substrate; forming a dummy gate pattern crossing over the active pattern; forming gate spacers on opposite first and second sidewalls of the dummy gate pattern; removing the dummy gate pattern to form a gate region exposing an upper surface and sidewalls of the active pattern between the gate spacers; recessing the upper surface of the active pattern exposed by the gate region to form a channel recess region; forming a channel pattern in the channel recess region by a selective epitaxial growth (SEG) process, the channel pattern having sidewalls and having a lattice constant different from that of the semiconductor substrate; and sequentially forming a gate dielectric layer and a gate electrode covering an upper surface and the sidewalls of the channel pattern in the gate region.

In some embodiments, the method may further include: forming a mold pattern covering the sidewalls of the active pattern in the gate region before the formation of the channel recess region. The mold pattern may expose the upper surface of the active pattern in the gate region, and the mold pattern may define the sidewalls of the channel pattern.

In some embodiments, the method may further include: removing the mold pattern to expose the sidewalls of the channel pattern before the formation of the gate dielectric layer and the gate electrode.

In some embodiments, the method may further include: forming a device isolation layer exposing a sidewall of an upper portion of the active pattern before the formation of the dummy gate pattern. An upper surface of the active pattern in the channel recess region may be lower than an upper surface of the device isolation layer.

In some embodiments, bottom surfaces of the gate spacers may be in contact with an upper surface of the active pattern.

In some embodiments, the upper surface of the channel pattern may be lower than bottom surfaces of the gate spacers.

In some embodiments, a width of an upper portion of the channel pattern may be greater than a width of a lower portion of the channel pattern in contact with the active pattern.

In some embodiments, an upper surface of the semiconductor substrate may have a (100) crystal plane, and the sidewall of the channel pattern may have a (110) crystal plane.

In some embodiments, the method may further include forming source and drain regions disposed on the active pattern at opposite first and second sides of the dummy gate pattern before removing the dummy gate pattern.

In another aspect, a method of manufacturing a semiconductor device may include: forming an active pattern on a semiconductor substrate, the active pattern protruding from the semiconductor substrate; forming source and drain regions disposed on the active pattern and spaced apart from each other; recessing an upper surface of the active pattern between the source and drain regions to form a channel recess region; forming a channel pattern in the channel recess region by a selective epitaxial growth (SEG) process, the channel pattern having sidewalls and having a lattice constant different from that of the semiconductor substrate; and forming a gate dielectric layer and a gate electrode crossing over the active pattern and covering an upper surface and the sidewalls of the channel pattern.

In some embodiments, the method may further include: forming a dummy gate pattern crossing over the active pattern before the formation of the source and drain regions; forming gate spacers on opposite first and second sidewalls of the dummy gate pattern; and removing the dummy gate pattern to form a gate region exposing the upper surface and sidewalls of the active pattern between the gate spacers before recessing the upper surface of the active pattern.

In some embodiments, the method may further include: forming a mold pattern covering the sidewalls of the active pattern in the gate region before the formation of the channel recess region. The mold pattern may expose the upper surface of the active pattern in the gate region, and the mold pattern may define the sidewall of the channel pattern.

In some embodiments, the method may further include removing the mold pattern to expose the sidewall of the channel pattern before the formation of the gate dielectric layer and the gate electrode.

In some embodiments, the gate spacers may be disposed between the source and drain regions, and wherein the channel pattern is disposed between the gate spacers.

In some embodiments, the method may further include: forming a device isolation layer exposing a sidewall of an upper portion of the active pattern before the formation of the dummy gate pattern. A recessed upper surface of the active pattern in the channel recess region may be lower than an upper surface of the device isolation layer.

In some embodiments, the upper surface of the channel pattern may be rounded.

In yet another aspect, a method of manufacturing a semiconductor device may include: patterning a semiconductor substrate to form active patterns extending in one direction; forming a dummy gate pattern crossing over the active patterns; forming gate spacers on both sidewalls of the dummy gate pattern; removing the dummy gate pattern to form a gate region exposing upper surfaces and sidewalls of the active patterns between the gate spacers; forming a mold pattern filing a space between the active patterns in the gate region, the mold pattern exposing the upper surfaces of the active patterns in the gate region; recessing the upper surfaces of the active patterns exposed by the gate region to form a channel recess region; forming a channel pattern in the channel recess region by a selective epitaxial growth (SEG) process, the channel pattern having sidewalls and having a lattice constant different from that of the semiconductor substrate; and forming a gate dielectric layer and a gate electrode covering an upper surface and the sidewalls of the channel pattern in the gate region.

In some embodiments, the channel pattern may be in contact with a sidewall of the mold pattern when the selective epitaxial growth (SEG) process is performed. The method further including removing the mold pattern to expose the sidewalls of the channel pattern before the formation of the gate dielectric layer and the gate electrode.

In some embodiments, the method may further include forming a device isolation layer exposing sidewalls of upper portions of the active patterns before the formation of the dummy gate pattern. Recessed upper surfaces of the active patterns in the channel recess region may be lower than an upper surface of the device isolation layer.

In some embodiments, the method may further include forming source and drain regions disposed on the active patterns at both sides of the dummy gate pattern before removing the dummy gate pattern.

In another aspect, a semiconductor device may include: an active pattern protruding from a semiconductor substrate; source/drain regions disposed on the active pattern and spaced apart from each other; a channel pattern in a channel region disposed between the source/drain regions, the channel pattern being locally formed on the active pattern and having a lattice constant different from that of the active pattern; a gate electrode crossing over the active pattern and covering an upper surface and sidewalls of the channel pattern; and gate spacers formed on opposite first and second sidewalls of the gate electrode.

In some embodiments, the semiconductor device may further include: a device isolation layer defining a sidewall of the active pattern. An upper surface of the active pattern in the channel region may be lower than an upper surface of the device isolation layer.

In some embodiments, the channel pattern may have a width substantially equal to a width of the gate electrode.

In some embodiments, the channel pattern may have a rounded upper surface.

In some embodiments, an upper surface of the channel pattern may be lower than bottom surfaces of the gate spacers.

In some embodiments, bottom surfaces of the gate spacers may be in contact with an upper surface of the active pattern.

In some embodiments, an upper surface of the semiconductor substrate may have a (100) crystal plane, and the sidewalls of the channel pattern may have a (110) crystal plane.

BRIEF DESCRIPTION OF THE DRAWINGS

Various aspects of the inventive concepts will become more apparent in view of the attached drawings and accompanying detailed description.

FIGS. 2A to 13A are perspective views illustrating a method of manufacturing a semiconductor device according to some embodiments of the inventive concepts;

FIGS. 2B to 13B are cross-sectional views taken along lines I-I', II-II', and III-III' of FIGS. 2A to 13A to illustrate a method of manufacturing a semiconductor device according to some embodiments of the inventive concepts;

DETAILED DESCRIPTION OF THE EMBODIMENTS

Figure 1:
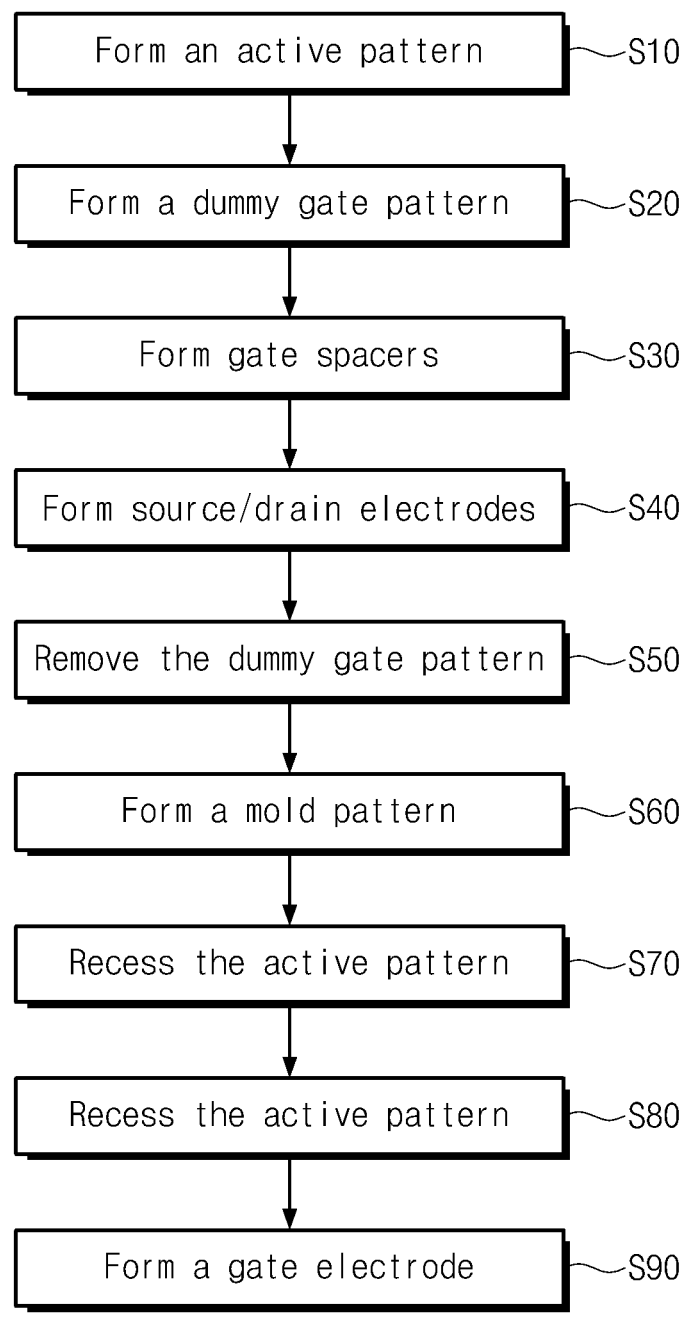
FIG. 1 is a flowchart illustrating a method of manufacturing a semiconductor device according to some embodiments of the inventive concepts.

Aspects of the inventive concepts will be described more fully hereinafter with reference to the accompanying drawings, in which exemplary embodiments of the inventive concepts are shown. The advantages and features of the inventive concepts and methods of achieving them will be apparent from the following exemplary embodiments. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and certain features depicted in the drawings are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly," or the use of certain terms such as "contacting" or "touching" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless the context indicates otherwise, these terms are only used to distinguish one element from another element, for example as a naming convention. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

FIG. 1 is a flowchart illustrating a method of manufacturing a semiconductor device according to some embodiments of the inventive concepts. FIGS. 2A to 13A are perspective views illustrating a method of manufacturing a semiconductor device according to some embodiments of the inventive concepts. FIGS. 2B to 13B are cross-sectional views taken along lines II', II-II', and III-III' of FIGS. 2A to 13A to illustrate a method of manufacturing a semiconductor device according to some embodiments of the inventive concepts. FIG. 14 is a cross-sectional view illustrating a method of manufacturing a semiconductor device according to other embodiments of the inventive concepts.

Figure 15A:
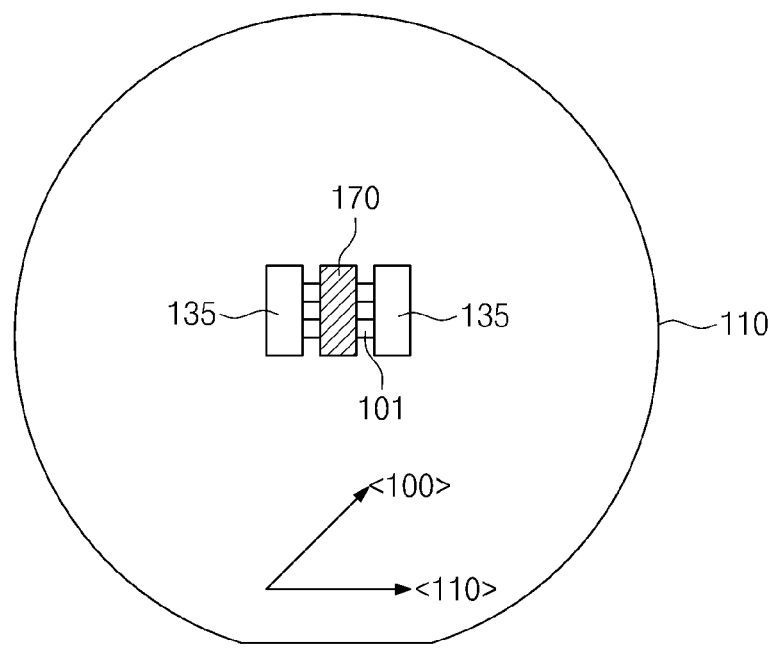
FIGS. 15A to 15C are views illustrating an embodiment of a method for forming a channel pattern in a method of manufacturing a semiconductor device according to embodiments of the inventive concepts.
Figure 15B:
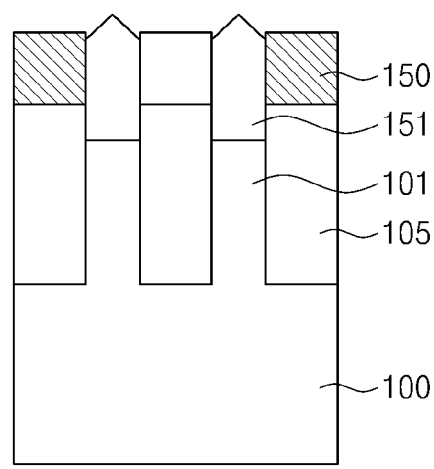
Figure 15C:
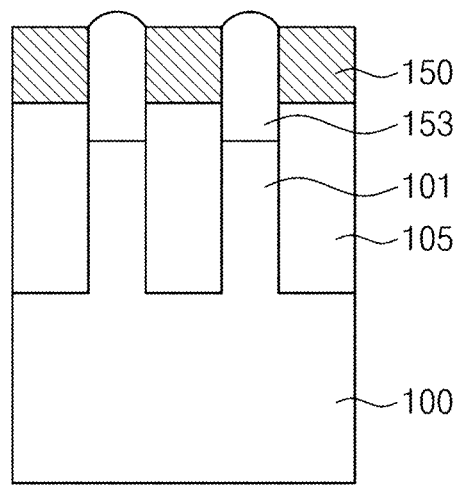
Figure 16A:
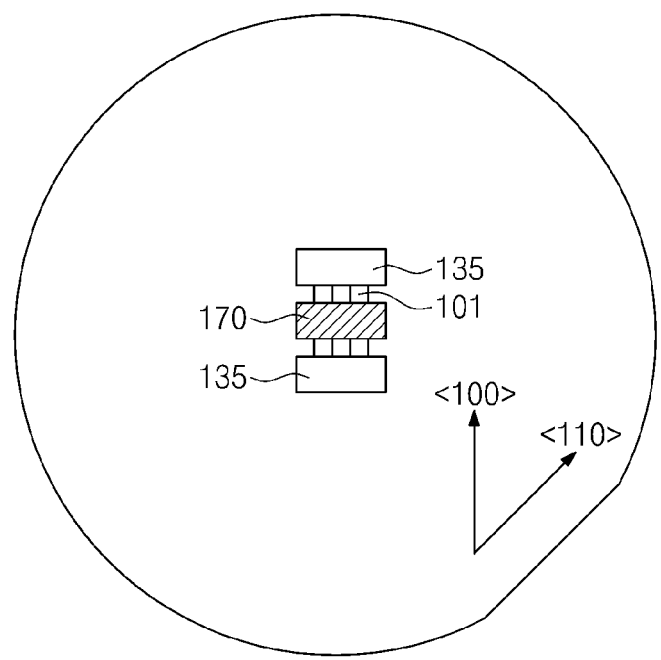
FIGS. 16A to 16C are views illustrating another embodiment of a method for forming a channel pattern in a method of manufacturing a semiconductor device according to embodiments of the inventive concepts.
Figure 16B:
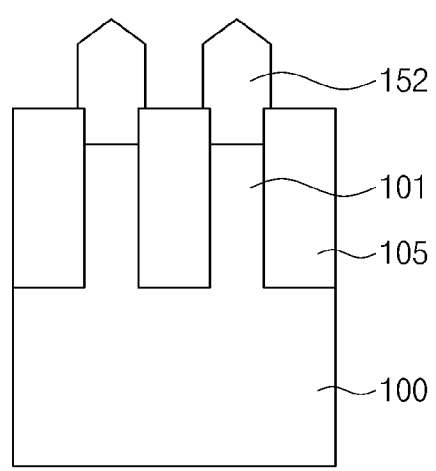
Figure 16C:
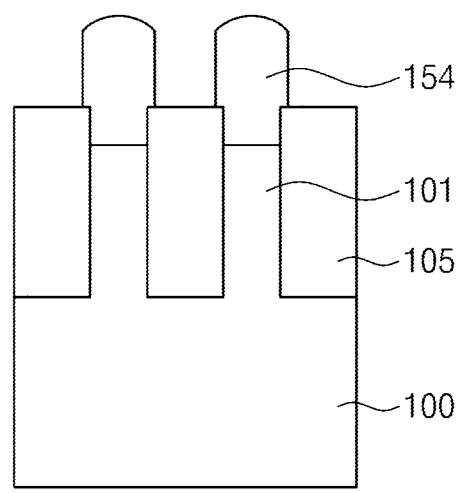

FIGS. 15A to 15C are views illustrating an embodiment of a method for forming a channel pattern in a method of manufacturing a semiconductor device according to embodiments of the inventive concepts. FIGS. 16A to 16C are views illustrating another embodiment of a method for forming a channel pattern in a method of manufacturing a semiconductor device according to embodiments of the inventive concepts.

Figure 2A:
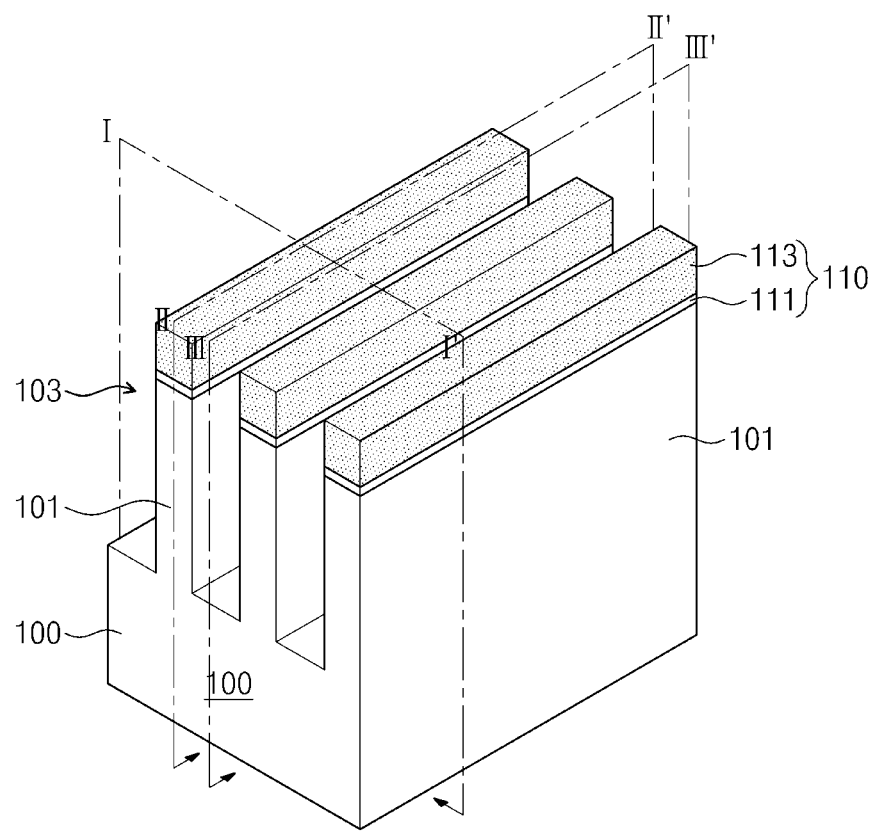

Referring to FIGS. 1, 2A, and 2B, a semiconductor substrate 100 may be patterned to form active patterns 101 (S10).

In detail, forming the active patterns 101 may include forming a mask pattern 100 exposing predetermined regions of the semiconductor substrate 100, and then anisotropically etching the semiconductor substrate 100 using the mask pattern 110 as an etch mask to form trenches 103.

In some embodiments, the mask pattern 110 may have a linear shape extending in a first direction (e.g., an x-axis direction) and may include an oxide pattern 111 and a hard mask pattern 113 which are sequentially stacked. In more detail, a silicon oxide layer and a hard mask layer may be sequentially stacked on the semiconductor substrate 100, and a photoresist pattern (not shown) defining the active patterns 101 may be then formed on the hard mask layer. The hard mask layer and the silicon oxide layer may be anisotropically etched using the photoresist pattern (not shown) as an etch mask until an upper surface of the semiconductor substrate 100 is exposed, thereby forming the mask pattern 110. The photoresist pattern (not shown) may have a linear shape extending in the first direction (e.g., the x-axis direction). The silicon oxide layer may be formed, for example, by thermally oxidizing the semiconductor substrate 100. This silicon oxide layer may relieve stress between the semiconductor substrate 100 and the hard mask layer. For example, the hard mask layer may be formed of at least one of a silicon nitride layer, a silicon oxynitride layer, or a poly-silicon layer. A thickness of the hard mask layer may be changed depending on a depth of trenches 103 formed in the semiconductor substrate 100. The hard mask layer may be thicker than the silicon oxide layer. In some embodiments, the photoresist pattern (not shown) may be removed after the formation of the mask pattern 110.

Next, the semiconductor substrate 100 is anisotropically etched using the mask pattern 110 as an etch mask. At this time, the semiconductor substrate 100 is anisotropically etched to a predetermined depth. Thus, the trenches 103 defining the active patterns 101 may be formed in the semiconductor substrate 100. The trenches 103 may have linear shapes extending in the first direction (e.g., the x-axis direction). A width of a lower region of the trench 103 may be less than a width of an upper region of the trench 103 by the anisotropic etching process. For example, a width of the trench 103 may become progressively less toward a bottom of the trench 103, and the trench 103 may have an inclined sidewall profile.

Figure 3A:
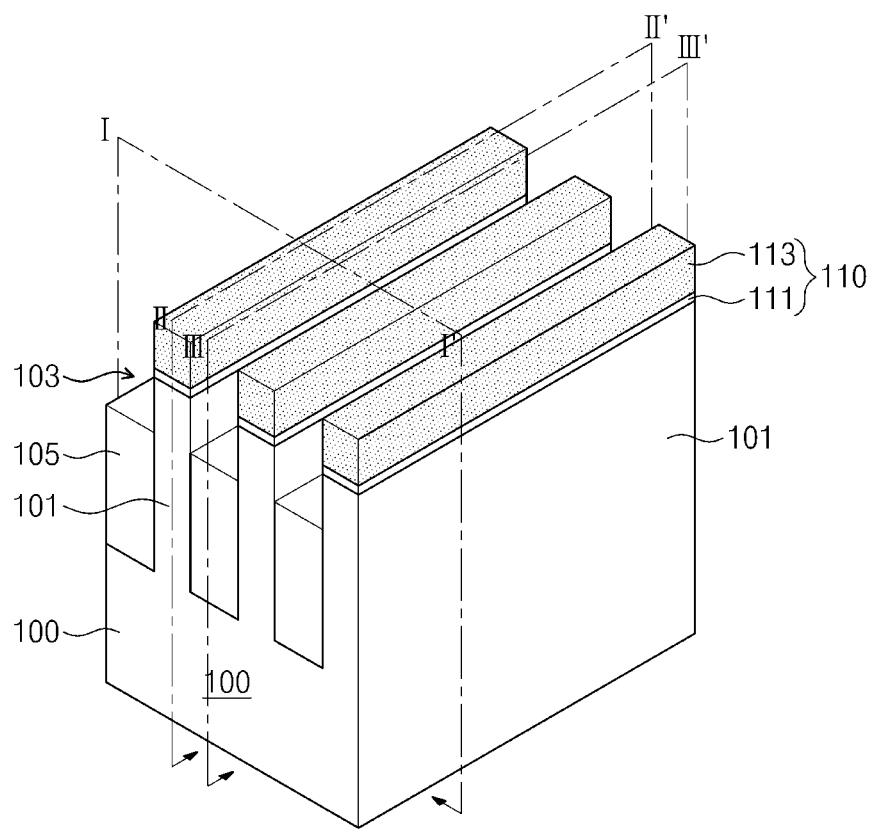
Figure 3B:
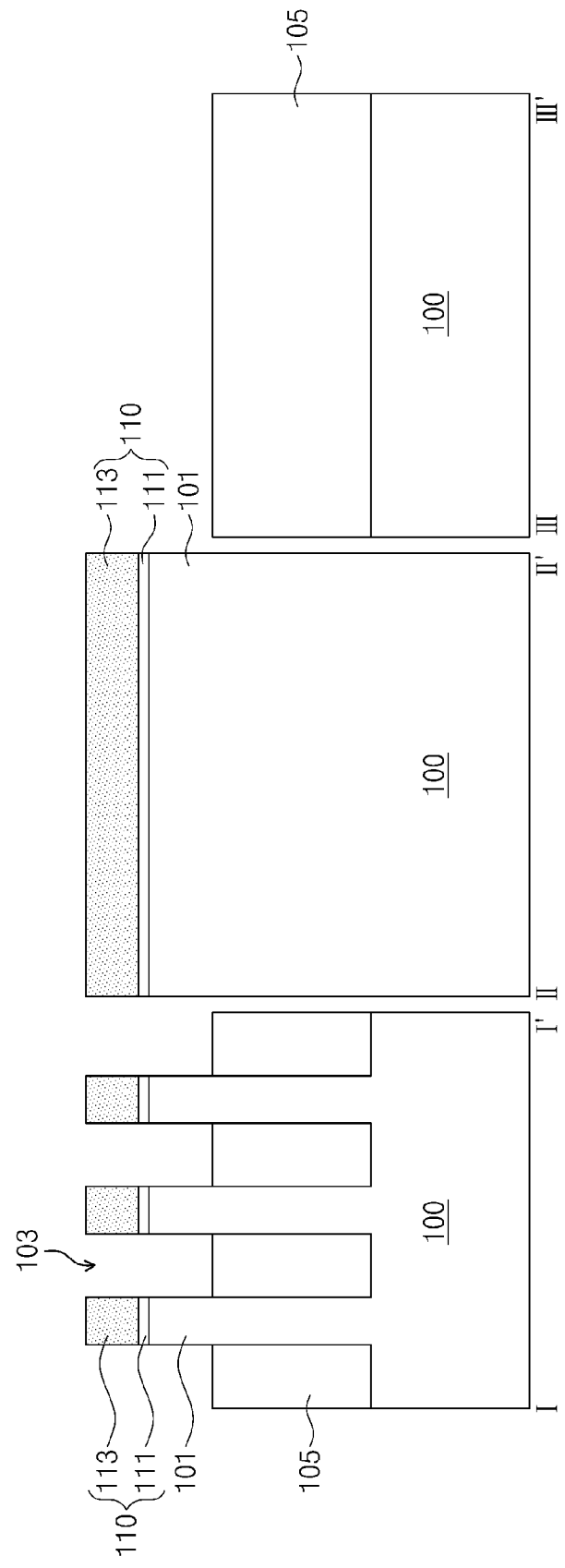

Referring to FIGS. 3A and 3B, a device isolation layer 105 may be formed in the trenches 103. The device isolation layer 105 may expose sidewalls of upper portions of the active patterns 101. As such, an upper surface of the device isolation layer 105 may be lower than upper surfaces of the active patterns 101.

In some embodiments, an insulating layer may be formed to fill the trenches 103, and the insulating layer may be planarized to expose an upper surface of the mask pattern 110. And then, an upper surface of the planarized insulating layer may be recessed to form the device isolation layer 105 and to expose the sidewalls of the upper portions of the active patterns 101. In one embodiment, the insulating layer filling the trenches 103 may be deposited using a deposition technique having an excellent step coverage property. In addition, the insulating layer may be formed of an insulating material having an excellent gap fill property. For example, the insulating layer may be formed of at least one of a boron-phosphor silicate glass (BPSG) layer, a high density plasma (HDP) oxide layer, an undoped silicate glass (USG) layer, or a Tonen SilaZene (TOSZ) layer. The planarization process of the insulating layer may be performed using an etch-back method and/or a chemical mechanical polishing (CMP) method. The upper surface of the planarized insulating layer may be recessed by selectively etching the planarized insulating layer using an etch recipe having an etch selectivity with respect to the active patterns 101. The hard mask pattern 113 may be removed after the formation of the device isolation layer 105.

Figure 4A:
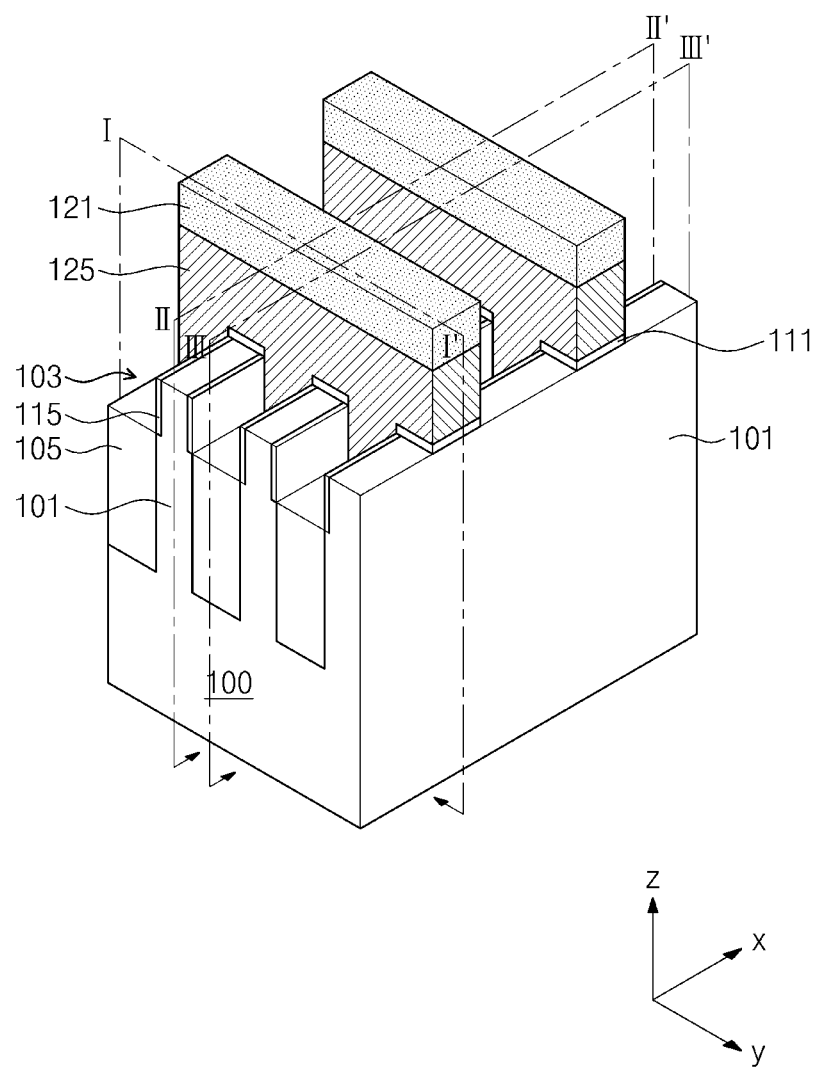
Figure 4B:
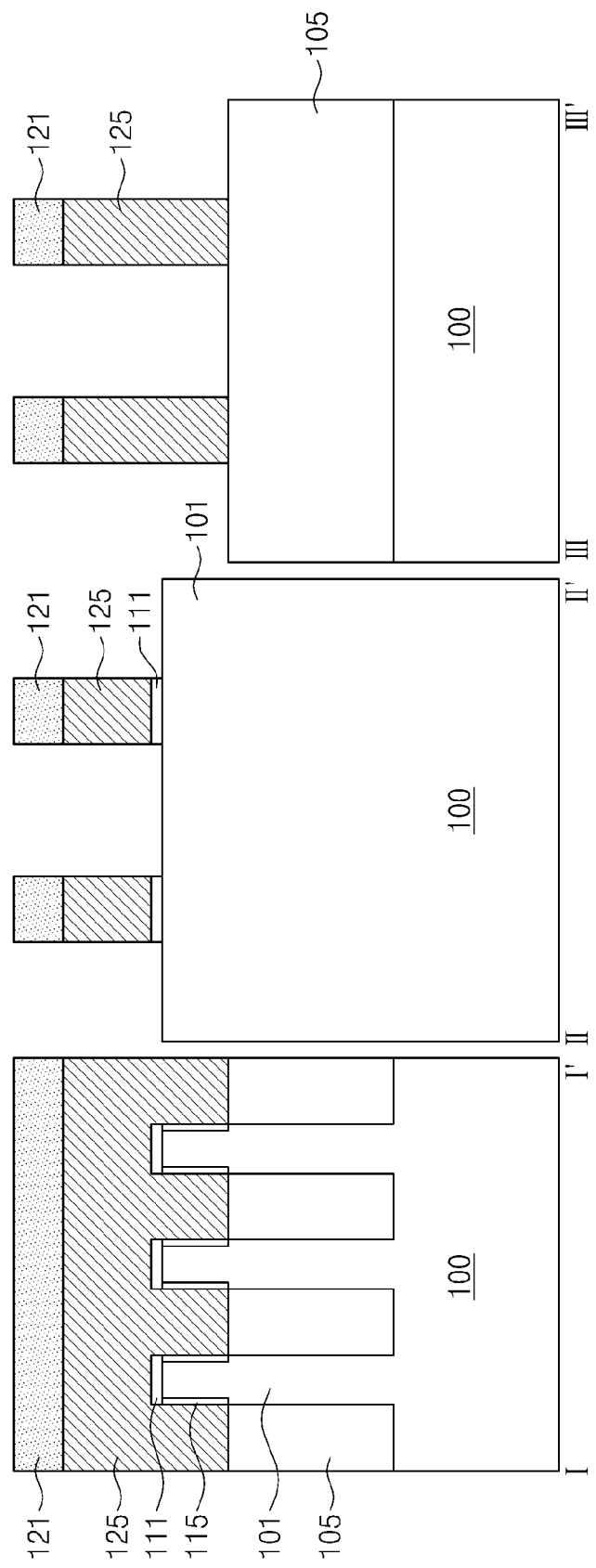

Referring to FIGS. 1, 4A, and 4B, a dummy gate pattern 125 is formed to cross over the active patterns 101 (S20).

In more detail, a dummy gate layer may be formed to cover the active patterns 101, and a gate mask pattern 121 crossing over the active patterns 101 may be then formed on the dummy gate layer. For example, the dummy gate layer may be anisotropically etched using the gate mask pattern 121 to form the dummy gate pattern 125.

In some embodiments, the dummy gate layer may fill a space between the active patterns 101 and may be formed of a material having an etch selectivity with respect to the device isolation layer 105 and the active patterns 101. For example, the dummy gate layer may be formed of a poly-silicon layer doped with dopants, an undoped poly-silicon layer, a silicon-germanium layer, or a silicon carbide layer. The dummy gate layer may be formed by a chemical vapor deposition (CVD) method, a physical vapor deposition (PVD) method, or an atomic layer deposition (ALD) method. After the dummy gate layer is deposited by the deposition method, an upper surface of the deposited dummy gate layer may be planarized. In some embodiments, the device isolation layer 105 may be used as an etch stop layer when the dummy gate layer is anisotropically etched.

In this embodiment, a sidewall oxide layer 115 may be formed to cover the sidewalls of the upper portions of the active patterns 101 exposed by the device isolation layer 105 before the formation of the dummy gate layer. The sidewall oxide layer 115 may be formed, for example, by thermally oxidizing the sidewalls of the upper portions of the active patterns 101.

Figure 5A:
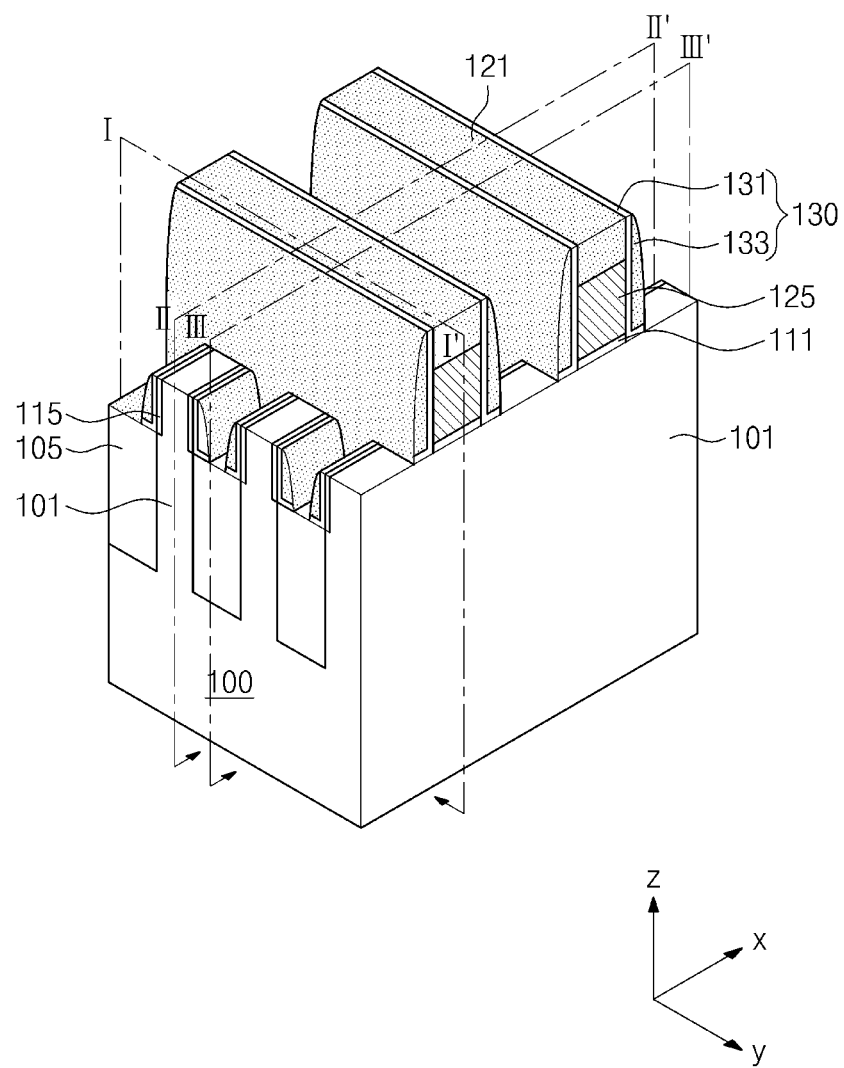
Figure 5B:
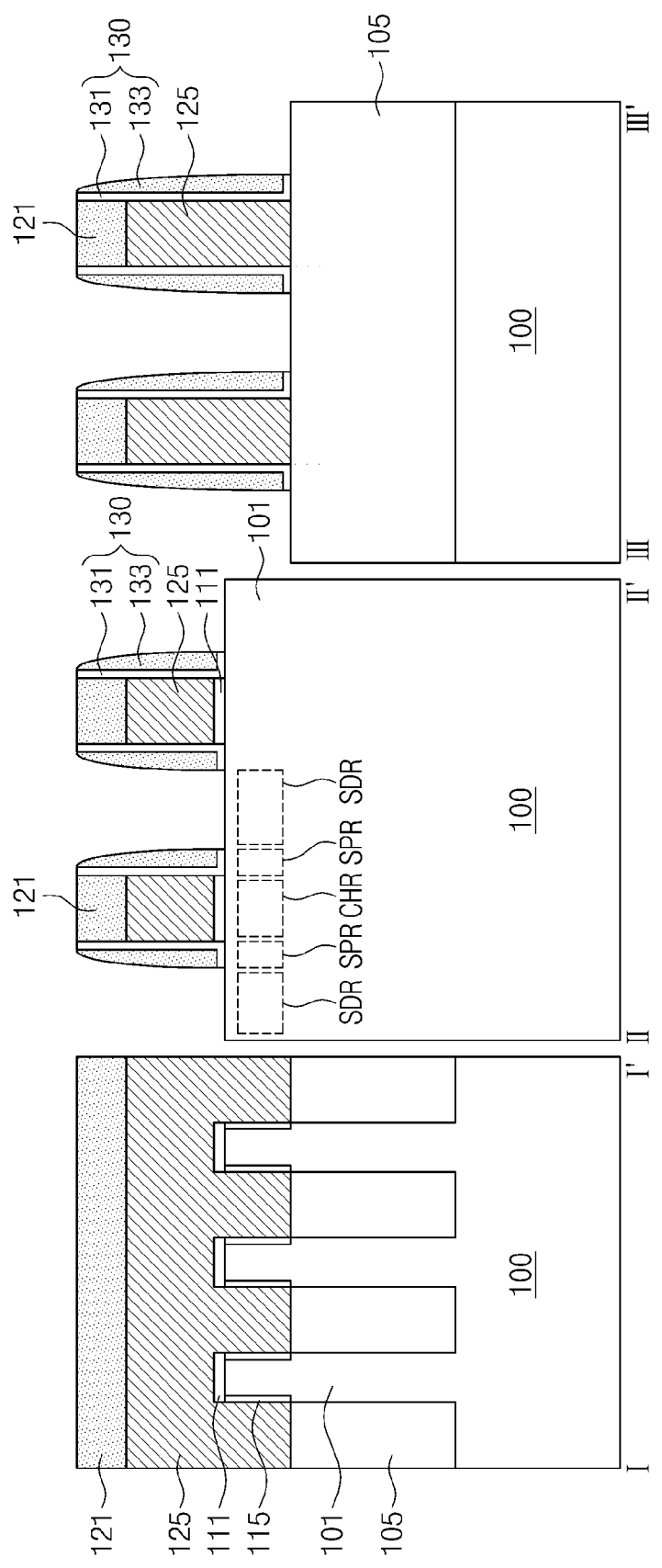

Referring to FIGS. 1, 5A, and 5B, gate spacers 130 may be formed on both sidewalls (e.g., opposite first and second sidewalls) of the dummy gate pattern 125 (S30).

In some embodiments, each of the gate spacers 130 may include a protecting spacer 131 and a sidewall spacer 133 which are sequentially stacked. The protecting spacer 131 may contact the sidewall of the dummy gate pattern 125.

In some embodiments, a protecting spacer layer and a sidewall spacer layer may be conformally deposited on the semiconductor substrate 100 having the dummy gate pattern 125, and the deposited protecting spacer layer and sidewall spacer layer may be anisotropically etched by a blanket etching process to form the gate spacers 130. In some embodiments, the protecting spacer 131 may be formed of a material having an etch selectivity with respect to the gate mask pattern 121 and the dummy gate pattern 125. For example, the protecting spacer 131 may be formed of a silicon oxide layer. Alternatively, the protecting spacer 131 may be formed of at least one layer of metal oxide layers such as a tantalum oxide layer, a titanium oxide layer, a hafnium oxide layer, a zirconium oxide layer, an aluminum oxide layer, a yttrium oxide layer, a niobium oxide layer, a cesium oxide layer, an indium oxide layer, an iridium oxide layer, a barium strontium titanate (BST) layer, and a lead zirconate titanate (PZT) layer. The sidewall spacer 133 may be formed of a material having an etch selectivity with respect to the protecting spacer 131. For example, the sidewall spacer 133 may be formed of a silicon nitride layer or a silicon oxynitride layer.

The dummy gate pattern 125 and the gate spacers 130 are formed as described above, so a channel region CHR, spacer regions SPR, and source/drain regions SDR may be defined in the active pattern 101. The channel region CHR may correspond to a portion of the active pattern 101 disposed under the dummy gate pattern 125. The source/drain regions SDR may correspond to other portions of the active pattern 101 which are disposed at both sides of the dummy gate pattern 125 (e.g., opposite first and second sides) and are horizontally separated from each other by the channel region CHR. The space regions SPR may correspond to still other portions of the active pattern 101 which are disposed between the channel region CHR and the source/drain regions SDR.

Figure 6A:
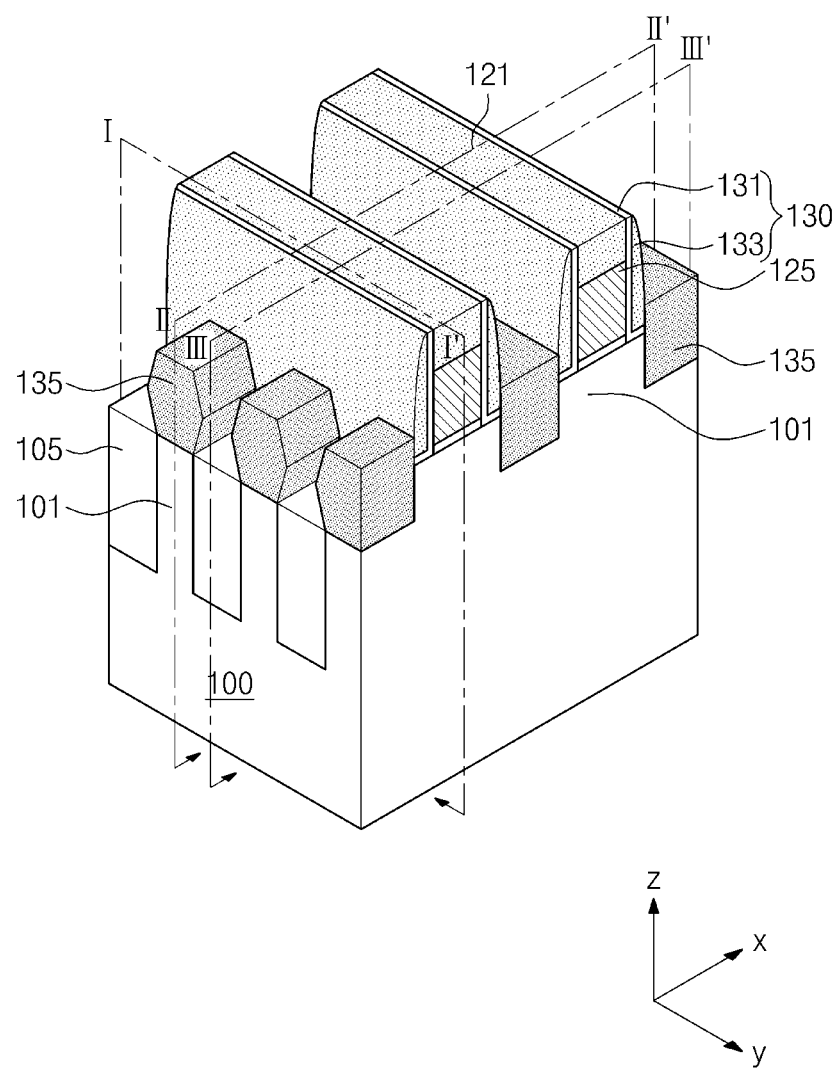
Figure 6B:
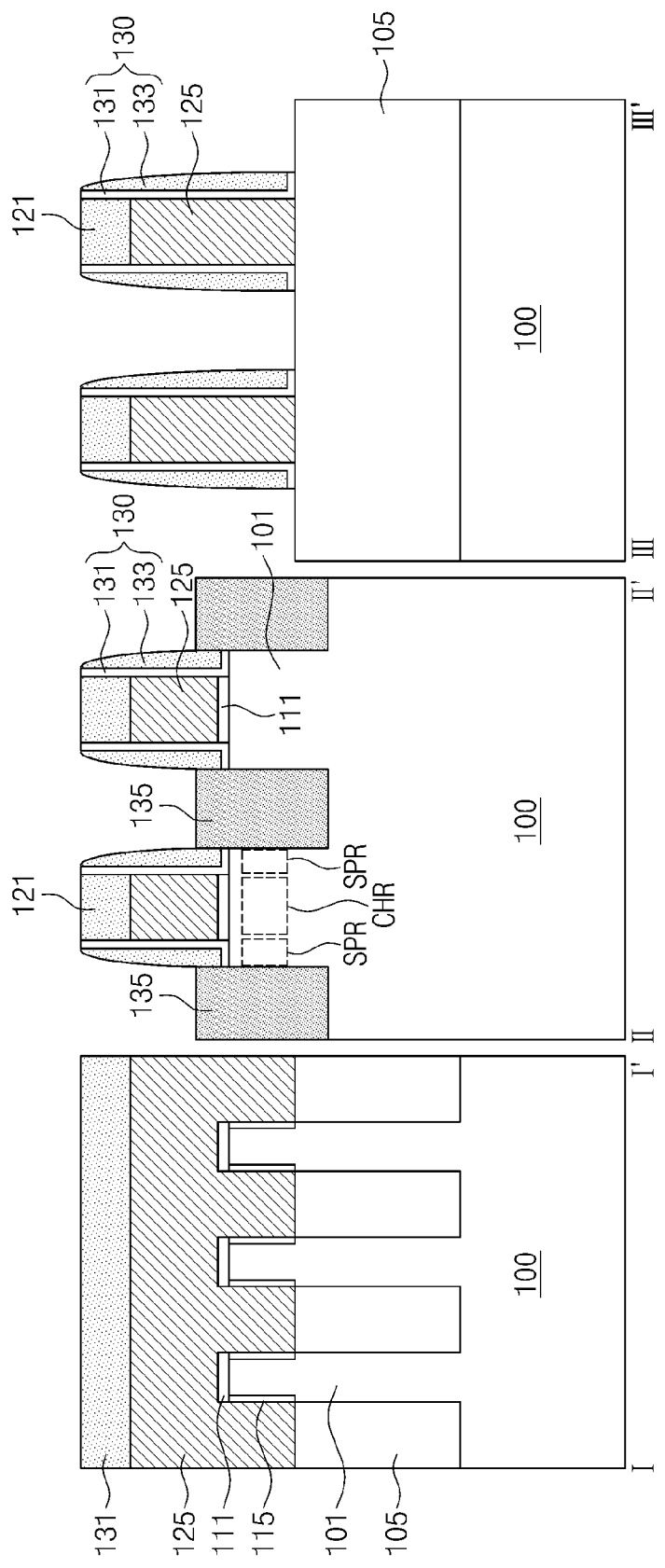

Referring to FIGS. 1, 6A, and 6B, source/drain electrodes 135 are formed at both sides of the dummy gate pattern 125 (S40).

The source/drain electrodes 135 may be formed at positions of the source/drain regions SDR of the active pattern 101. Thus, the channel region CHR of the active pattern 101 may be disposed between the source/drain electrodes 135 and the spacer regions SPR may be disposed between the channel region CHR and the source/drain electrodes 135.

In some embodiments, forming the source/drain electrodes 135 may include removing the source/drain regions SDR of the active pattern 101 and forming an epitaxial layer. If the semiconductor device has a complementary metal-oxide-semiconductor (CMOS) structure, forming the epitaxial layer may include forming a first epitaxial layer for a source/drain electrode of a NMOS field effect transistor and forming a second epitaxial layer for a source/drain electrode of a PMOS field effect transistor. In some embodiments, the first epitaxial layer may be configured to generate a tensile strain and the second epitaxial layer may be configured to generate a compressive strain. For example, the first epitaxial layer may be formed of silicon carbide (SiC), and the second epitaxial layer may be formed of silicon-germanium (SiGe). However, the inventive concepts are not limited thereto. A silicide layer (not shown) may be formed on each of the source/drain electrodes 135. The silicide layer may be formed, for example, of nickel silicide, cobalt silicide, tungsten silicide, titanium silicide, niobium silicide, or tantalum silicide.

In other embodiments, forming the source/drain electrodes 135 may include implanting N-type or P-type dopant ions into the source/drain regions SDR of the active pattern 101 using the dummy gate pattern 125 as an ion implantation mask.

Figure 7A:
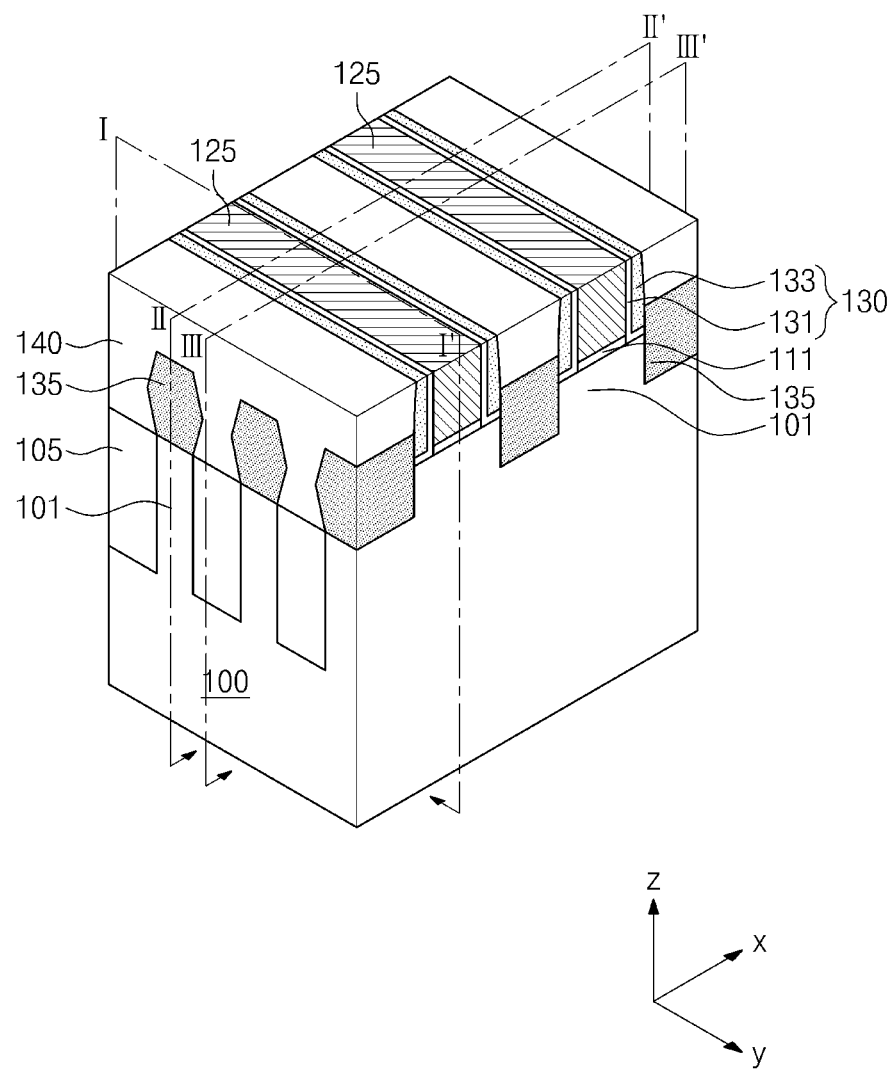
Figure 7B:
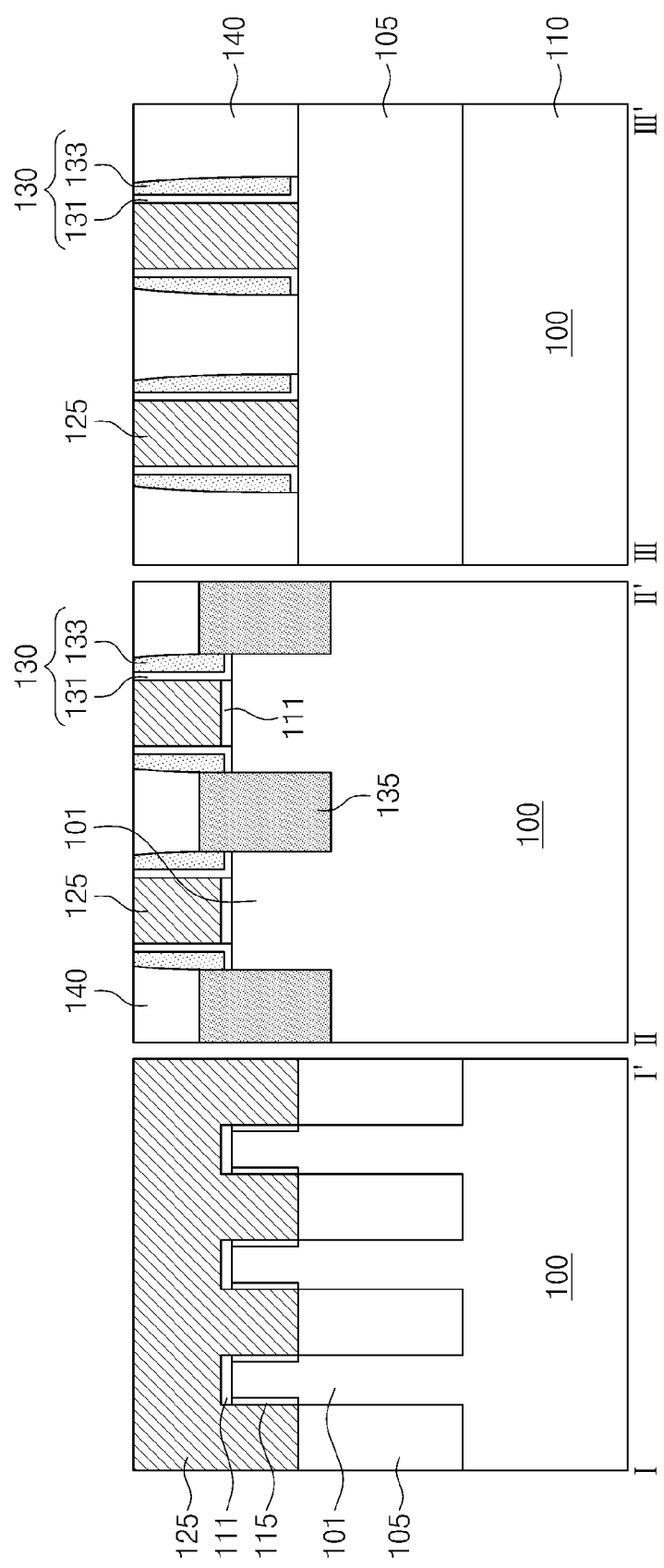

Referring to FIGS. 7A and 7B, an interlayer insulating layer 140 is formed to cover the source/drain electrodes 135 and to expose an upper surface of the dummy gate pattern 125.

In some embodiments, an insulating layer may be formed to cover the resultant structure having the source/drain electrodes 135, and the insulating layer may be then planarized until the upper surface of the dummy gate pattern 125 is exposed, thereby forming the interlayer insulating layer 140. The interlayer insulating layer 140 may include at least one of a silicon oxide layer, a silicon nitride layer, a silicon oxynitride layer, or low-k dielectric layers, for example.

Figure 8A:
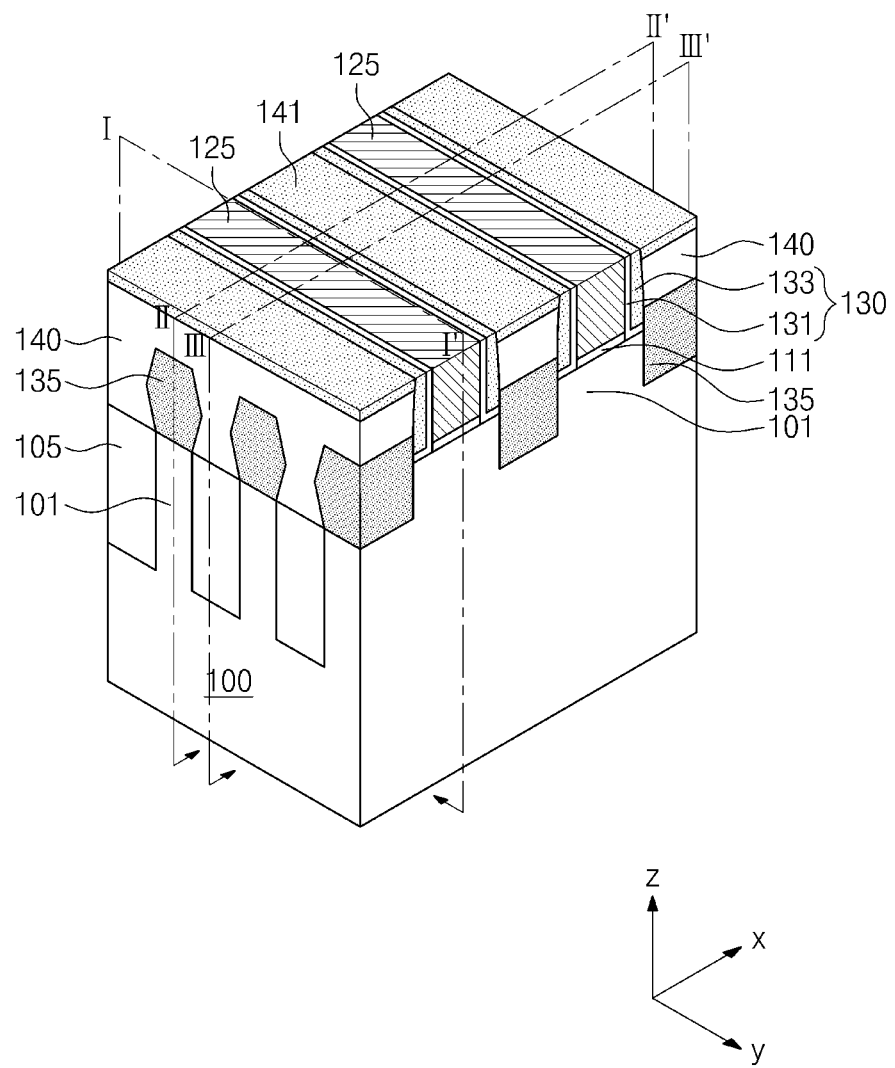

Referring to FIGS. 8A and 8B, an etch stop layer 141 exposing the upper surface of the dummy gate pattern 125 may be formed on an upper surface of the interlayer insulating layer 140. In some embodiments, forming the etch stop layer 141 may include recessing the upper surface of the interlayer insulating layer 140, forming an etch stop layer covering the recessed upper surface of the interlayer insulating layer 140 and the upper surface of the dummy gate pattern 125, and planarizing an upper surface of the etch stop layer to expose the upper surface of the dummy gate pattern 125. The etch stop layer 141 may be formed of a material having an etch selectivity with respect to the interlayer insulating layer 140. For example, the etch stop layer 141 may be formed of a silicon nitride layer or a silicon oxynitride layer. In other embodiments, the formation process of the etch stop layer 141 may be omitted.

Figure 9A:
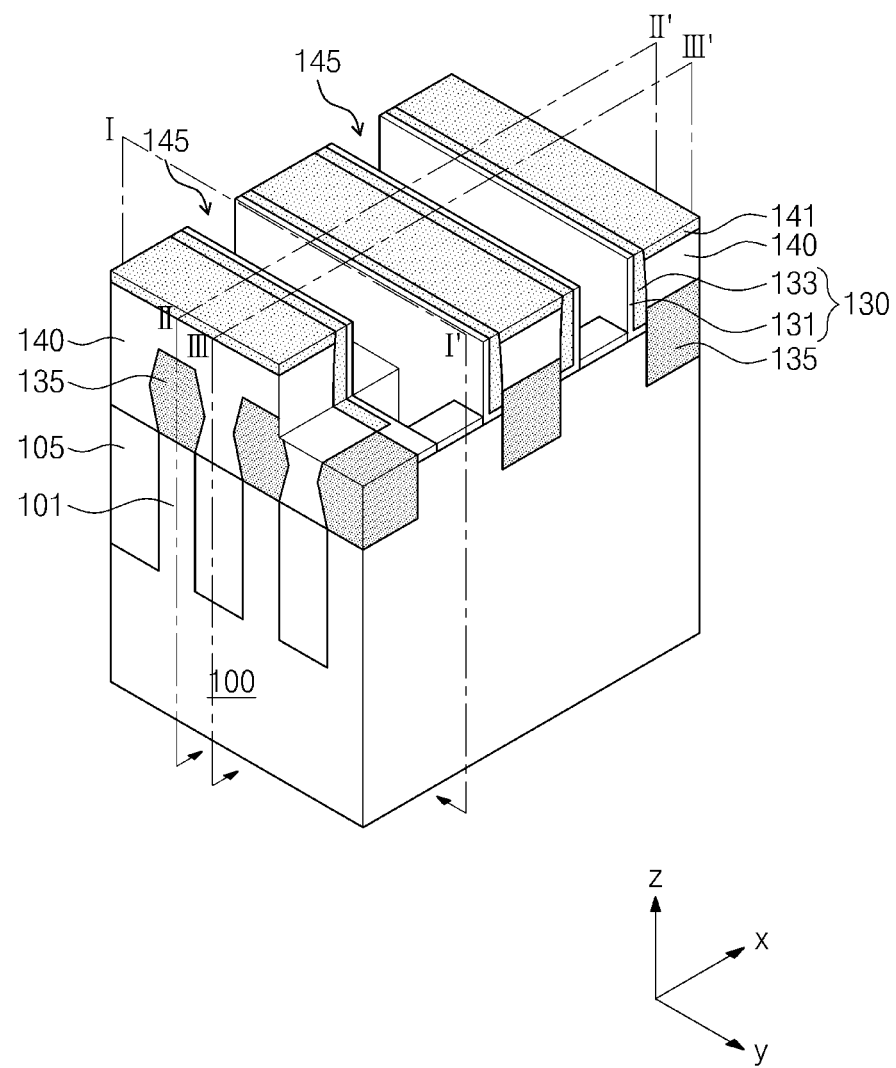
Figure 9B:
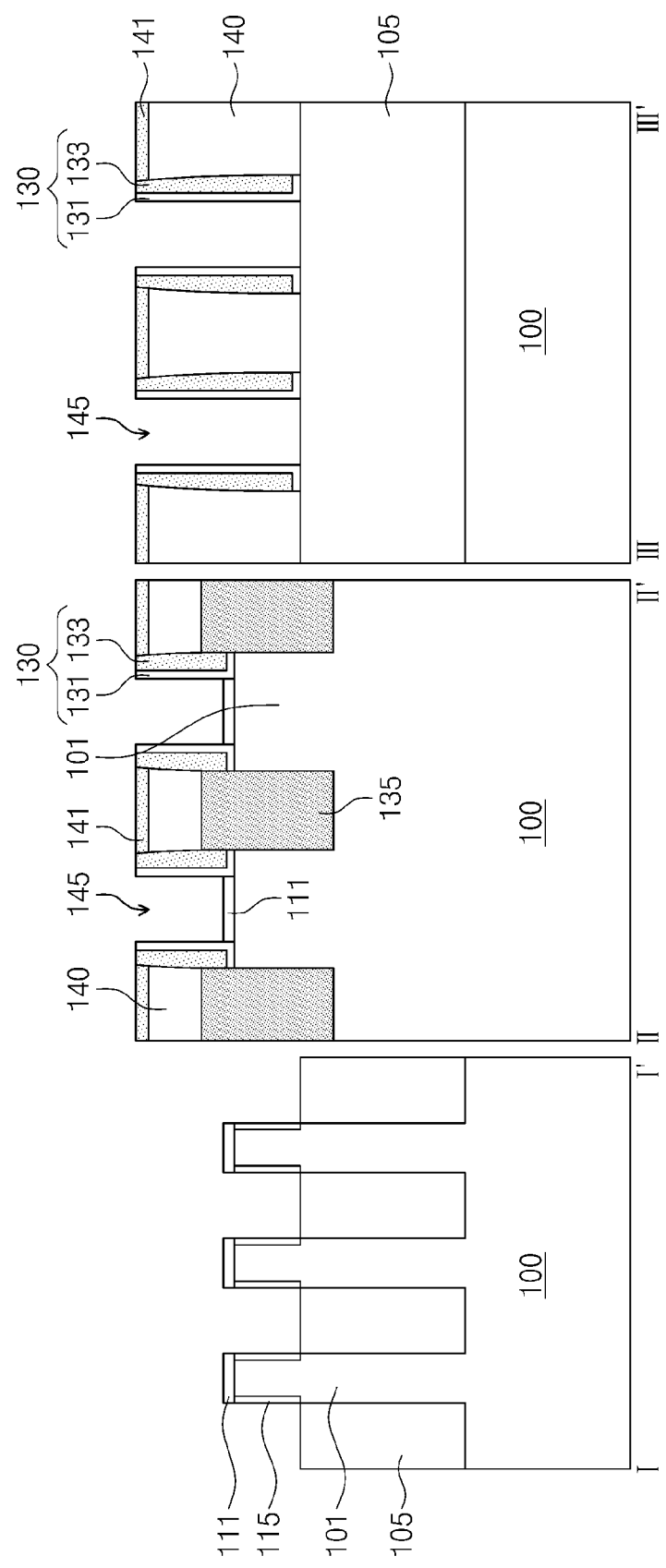

Referring to FIGS. 1, 9A, and 9B, the dummy gate pattern 125 is removed to form a gate region 145 between the gate spacers 130 (S50).

The dummy gate pattern 125 may be removed, for example, by a mixture of a dry etching process and a wet etching process. In more detail, the dummy gate pattern 125 may be wet-etched using an etch recipe having an etch selectivity with respect to the etch stop layer 141 and the gate spacers 130. In some embodiments, if the dummy gate pattern 125 is formed of silicon-germanium (SiGe), the dummy gate pattern 125 may be removed using an etch solution including ammonia water and hydrogen peroxide. In other embodiments, if the dummy gate pattern 125 is formed of polysilicon, the dummy gate pattern 125 may be wet-etched using an etch solution including nitric acid, acetic acid, and hydrofluoric acid.

The dummy gate pattern 125 may be removed to expose a portion of the oxide pattern 111 on the active patterns 101. A portion of the oxide pattern 111 on the active patterns 101 may also be etched during the removal of the dummy gate pattern 125. Sidewalls of the protecting spacers 131 may be exposed by the gate region 145. In addition, the gate region 145 may further expose the upper surface of the device isolation layer 105 and the sidewall oxide layer 115 formed on the sidewalls of the upper portions of the active patterns 101. A vertical length of the gate region 145 on the device isolation layer 105 may be greater than a vertical length of the gate region 145 on the active pattern 101.

Figure 10A:
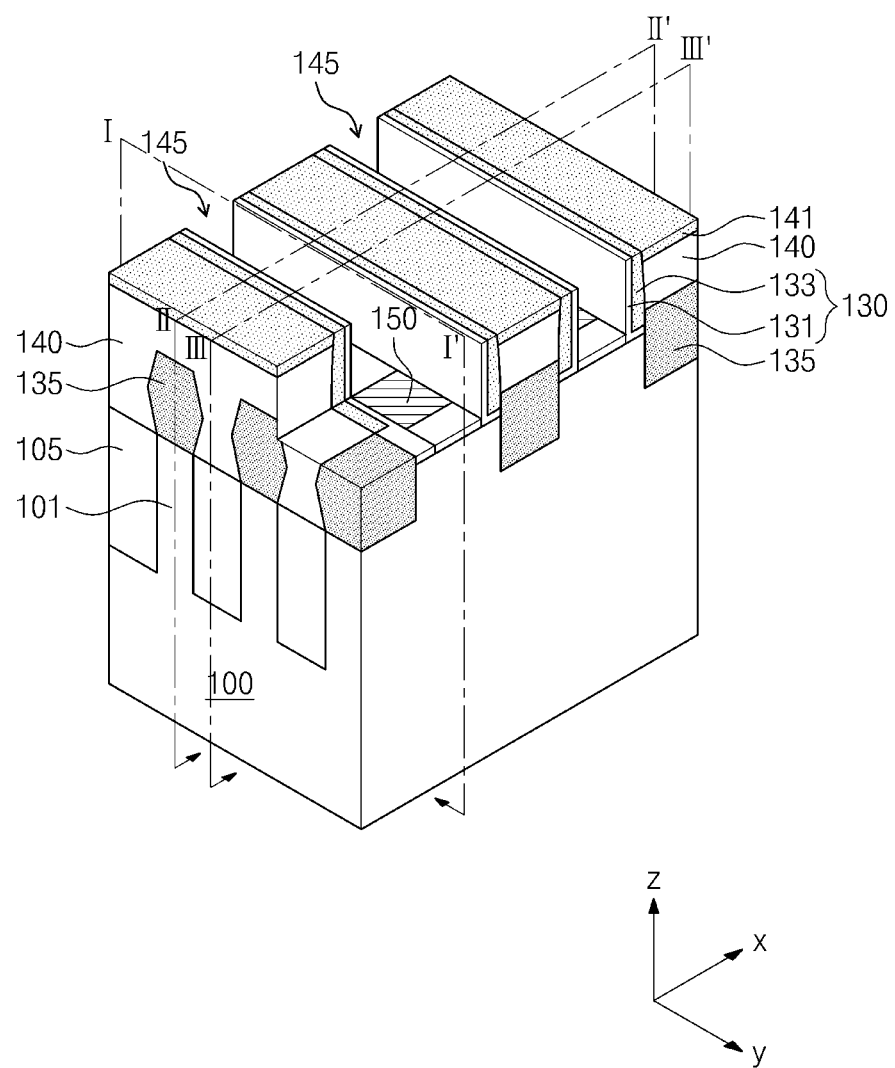
Figure 10B:
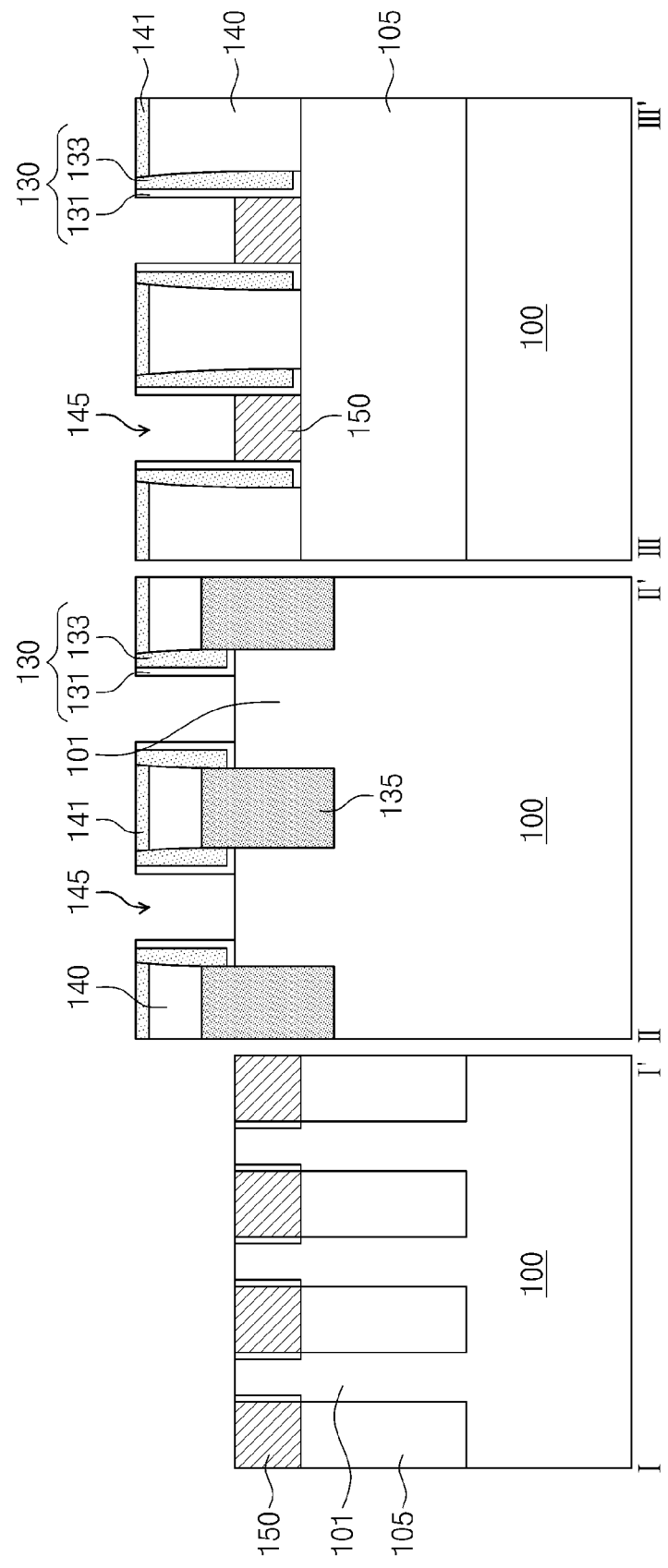

Referring to FIGS. 1, 10A, and 10B, a mold pattern 150 is formed in the gate region 145 (S60). The mold pattern 150 covers the sidewalls of the upper portions of the active patterns 101 in the gate region 145.

In some embodiments, the mold pattern 150 may be required in the event that the upper surface of the semiconductor substrate 100 has a (100) crystal plane and the active pattern 101 is formed in parallel to a <110> crystal direction.

In some embodiments, a mold layer may be formed to completely fill the gate 145, and an etching process may be performed on the mold layer until the upper surfaces of the active patterns 101 are exposed, thereby forming the mold pattern 150. When the mold layer is formed, a thickness of the mold layer disposed on the active pattern 101 may be different from a thickness of the mold layer disposed on the device isolation layer 105. The mold layer may be etched using an etch recipe having an etch selectivity with respect to the active patterns 101, the etch stop layer 141, and the gate spacers 130.

The mold pattern 150 formed as described above may cover the sidewalls of the active patterns 101 on the device isolation layer 105 but may expose the upper surfaces of the active patterns 101. In addition, the mold pattern 150 may expose sidewalls of upper portions of the gate spacers 130 on the device isolation layer 105. For example, the mold pattern 150 may fill a space between the active patterns 101 in the gate region 145. A plurality of mold patterns 150 may be formed in the gate region 145. Each active pattern 101 may be disposed between the mold patterns 150 in gate region 145.

The mold pattern 150 may be formed of an insulating material having an etch selectivity with respect to the active patterns 101 and the gate spacers 130. In addition, the mold pattern 150 may be formed of an insulating material also having an etch selectivity with respect to the interlayer insulating layer 140 or the etch stop layer 141. For example, the mold pattern 150 may be formed of at least one of silicon oxide, silicon nitride, silicon oxynitride, a photoresist, a spin-on-glass (SOG) material, or a spin-on-hardmask (SOH) material.

Figure 11A:
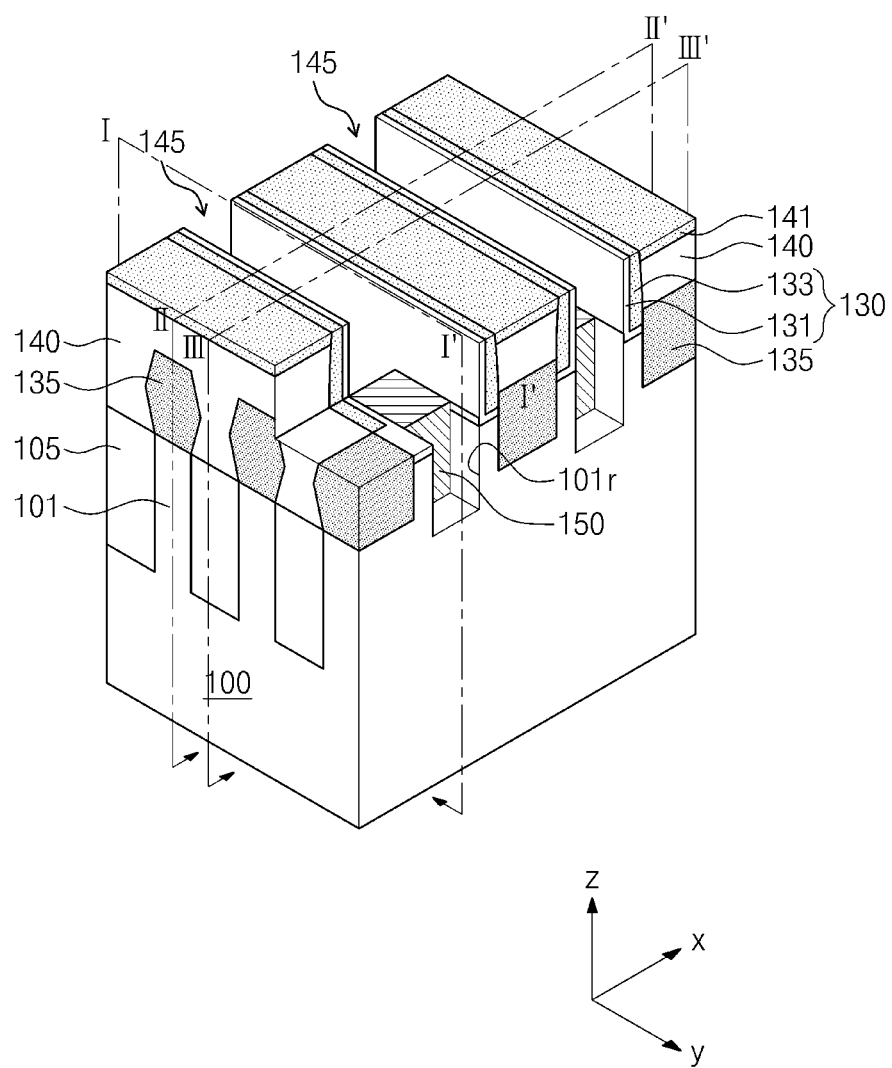
Figure 11B:
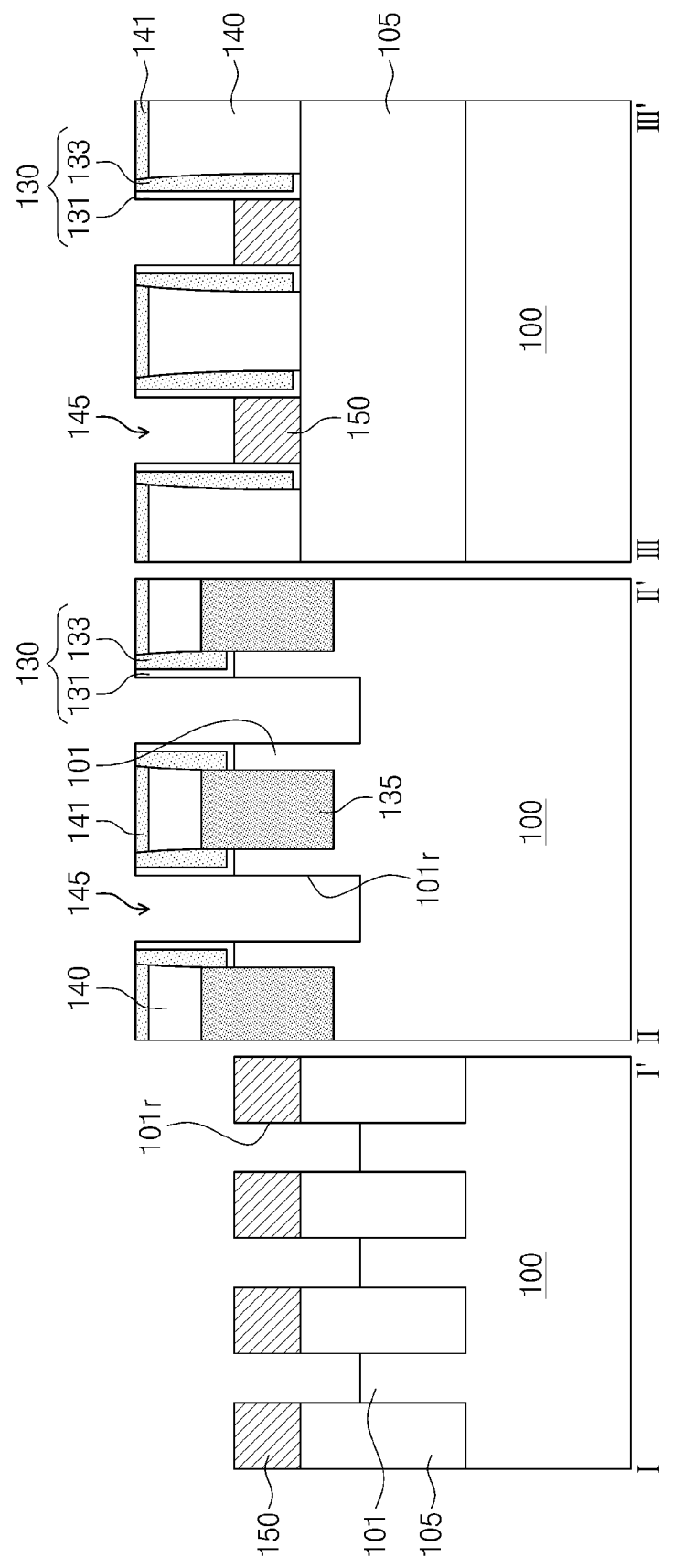

Referring to FIGS. 1, 11A, and 11B, the upper surfaces of the active patterns 101, which are exposed by the gate region 145, are recessed to form channel recess regions 101r (S70).

Portions of the active patterns 101 between the source/drain electrodes 135 may be anisotropically etched to form the channel recess regions 101r. In some embodiments, the mold pattern 150 may be used as an etch mask during the anisotropic etching process. Sidewalls of the mold pattern 150 may be exposed by the formation of the channel recess regions 101r. In some embodiments, a bottom surface of the channel recess region 101r may be lower than the upper surface of the device isolation layer 105. Thus, the channel recess region 101r may expose a portion of a sidewall of the device isolation layer 105 as well as the sidewall of the mold pattern 105. Alternatively, the bottom surface of the channel recess region 101r may be higher than the upper surface of the device isolation layer 105.

Figure 12A:
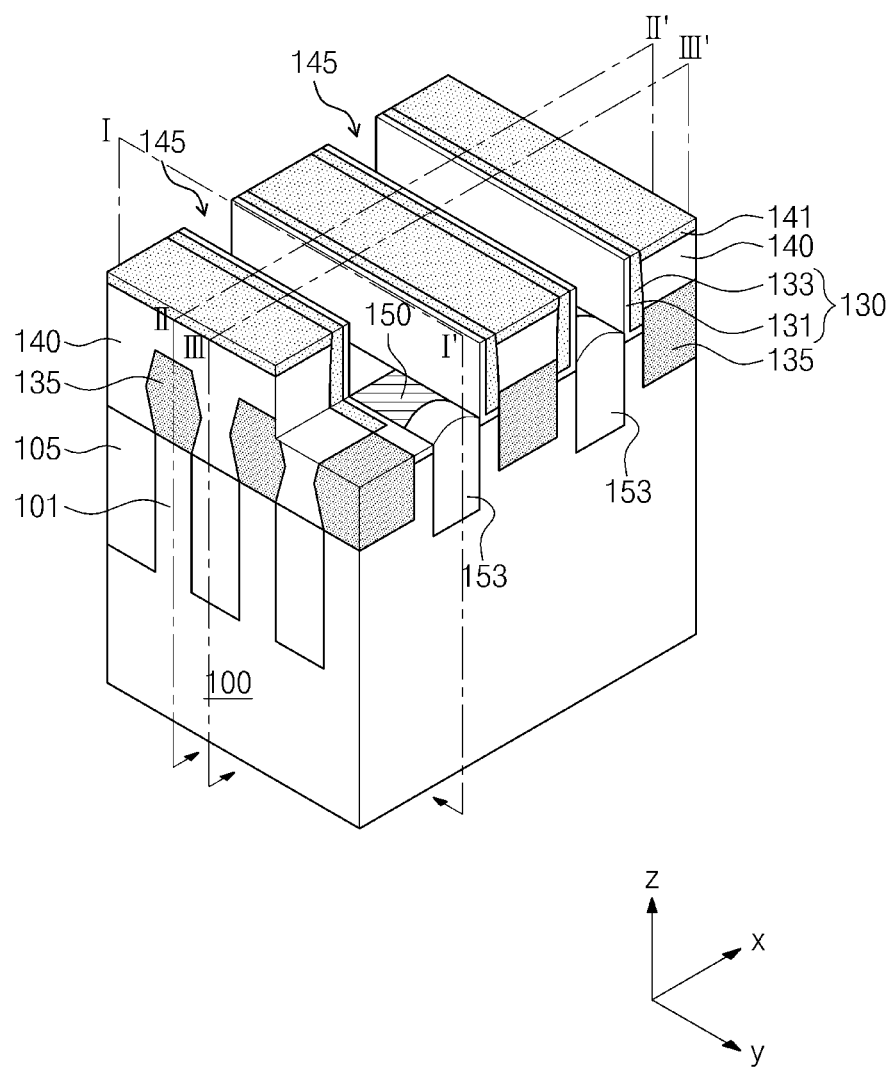
Figure 12B:
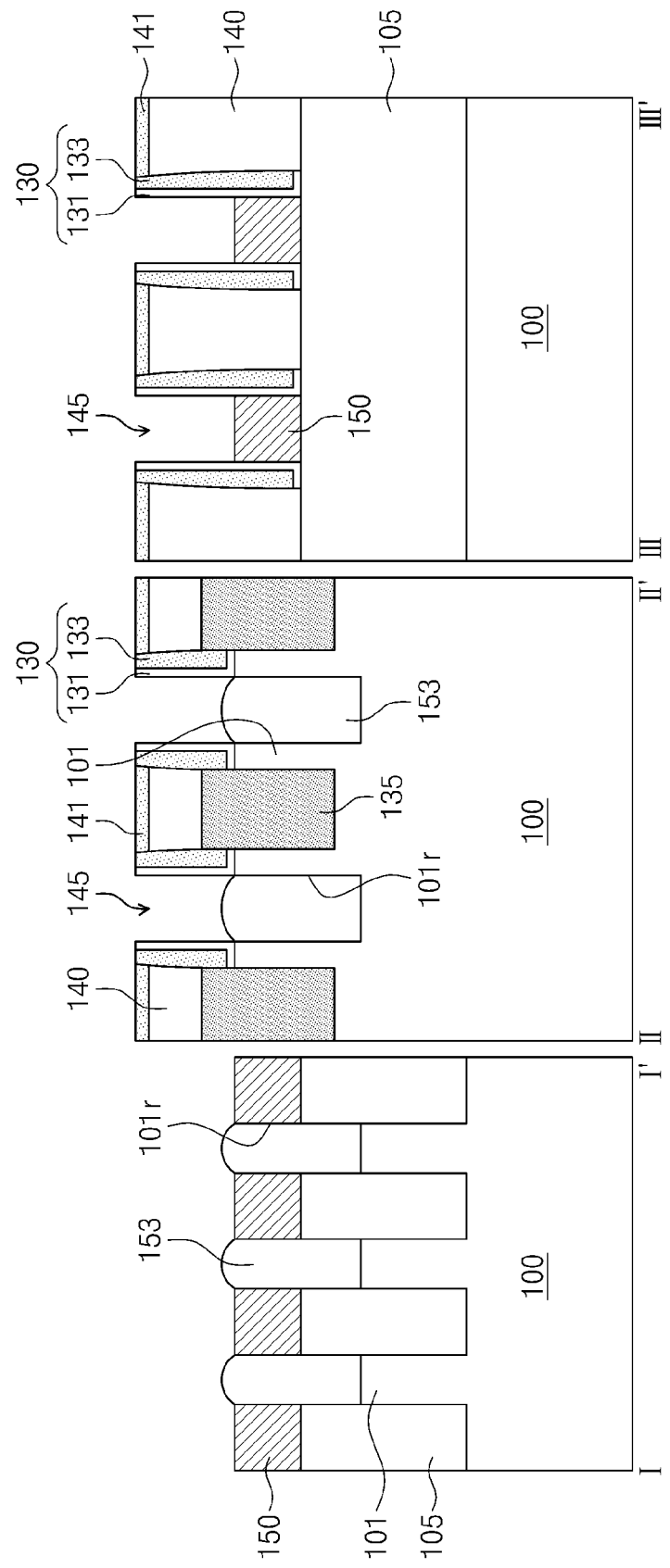

Referring to FIGS. 1, 12A, and 12B, a channel pattern 153 is formed by performing a selective epitaxial growth (SEG) process on the active pattern 101 exposed by the channel recess region 101r (S80).

According to embodiments of the inventive concepts, the channel pattern 153 may be formed of a material having a lattice constant different from that of the semiconductor substrate 100. For example, the channel pattern 153 may include silicon (Si), germanium (Ge), silicon-germanium (SiGe), or a III-V group compound. For example, the III-V group compound may be aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

In some embodiments, the channel pattern 153 may be formed of silicon-germanium ($Si_{1-x}Ge_x$, where "x" has a range of 0.1 to 0.9). A germanium (Ge) concentration of a lower portion of the channel pattern 153 may be different from that of an upper portion of the channel pattern 153.

According to embodiments of the inventive concepts, the SEG process may use a solid phase epitaxy (SPE) method, a vapor phase epitaxy (VPE) method, or a liquid phase epitaxy (LPE) method. In some embodiments, the VPE method may be used for the SEG process. In this case, the SEG process may uses a chemical vapor deposition (CVD) method, a reduced pressure chemical vapor deposition (RPCVD) method, an ultra high vacuum chemical vapor deposition (UHCVD) method, or a molecular beam epitaxy (MBE) method.

In some embodiments, an upper surface of the channel pattern 153 may be higher than the upper surface of the mold pattern 150 by the SEG process. Alternatively, the upper surface of the channel pattern 153 may be lower than the upper surface of the mold pattern 150. For example, the upper surface of the channel pattern 153 may be lower than bottom surfaces of the gate spacers 130, as illustrated in FIG. 14.

In some embodiments, the method for forming the channel pattern 153 may be varied according to a channel direction of the fin field effect transistor when the channel pattern 153 is formed using the SEG process.

In more detail, according to an embodiment illustrated in FIGS. 15A to 15C, the semiconductor substrate 100 may be a silicon substrate and an upper surface of the semiconductor substrate 100 may have the (100) crystal plane. In this embodiment, the active pattern 101 may be formed in parallel to the <110> crystal direction of the silicon substrate. When an epitaxial layer 151 is grown on this active pattern 101, the epitaxial layer 151 may be grown in a horizontal direction as well as a vertical direction. In this embodiment, since the growth in the horizontal direction of the epitaxial layer 151 may be blocked by the sidewall of the mold pattern 105, the mold pattern 150 may define a sidewall of the epitaxial layer 151. In addition, since a growth rate of the epitaxial layer 151 is varied according to a crystal direction when the epitaxial layer 151 is grown, an upper surface of the epitaxial layer 151 may have facets having crystal planes different from each other and may be elevated to be higher than the upper surface of the mold pattern 150. For example, the upper surface of the epitaxial layer 151 may have a wedge shape, as illustrated in FIG. 15B. Thus, after the formation of the epitaxial layer 151, a hydrogen ($H_2$) treatment process may be performed on the epitaxial layer 151 to form the channel pattern 153 having a rounded upper surface as illustrated in FIG. 15C.

Alternatively, according to an embodiment illustrated in FIGS. 16A to 16C, the mold pattern may not be formed after the formation of the gate region 145 of FIGS. 9A and 9B and then the channel recess region 101r of FIGS. 11A and 11B may be formed between the source/drain electrodes 135. Thereafter, it is possible to grow an epitaxial layer 152 having a sidewall substantially perpendicular to the upper surface of the active pattern 101 exposed through the channel recess region 101r. In more detail, the semiconductor substrate 100 may be a silicon substrate, the upper surface of the semiconductor substrate 100 may have the (100) crystal plane, and the active pattern 101 may be formed in parallel to a <100> crystal direction of the silicon substrate. In this case, the sidewall of the epitaxial layer 152 may be grown to have a (110) crystal plane by a difference between growth rates of crystal planes when the epitaxial layer 152 is grown by the selective epitaxial growth process. Crystal growth in the horizontal direction of the epitaxial layer 152 may be blocked by the (110) crystal plane during the growth of the epitaxial layer 152. As a result, the epitaxial layer 152 may have the sidewall substantially perpendicular to the upper surface of the active pattern 101 by only the selective epitaxial growth process without the mold pattern. In this embodiment, since the selective epitaxial growth process is performed without the mold pattern, a width of an upper portion of the epitaxial layer 152 (or a channel pattern 154) may be greater than a width a lower portion, which is in contact with the device isolation layer 105, of the epitaxial layer 152 (or the channel pattern 154). An upper surface of the epitaxial layer 152 may have facets having crystal planes different from each other, and thus, a hydrogen ($H_2$) treatment process may be performed on the epitaxial layer 152 to form the channel pattern 154 having a rounded upper surface.

Referring again to FIGS. 12A and 12B, the mold patterns 150 may be removed after the channel pattern 153 is formed between the mold patterns 150. The sidewalls of the channel patterns 153 may be exposed by the removal of the mold patterns 150.

Figure 13A:
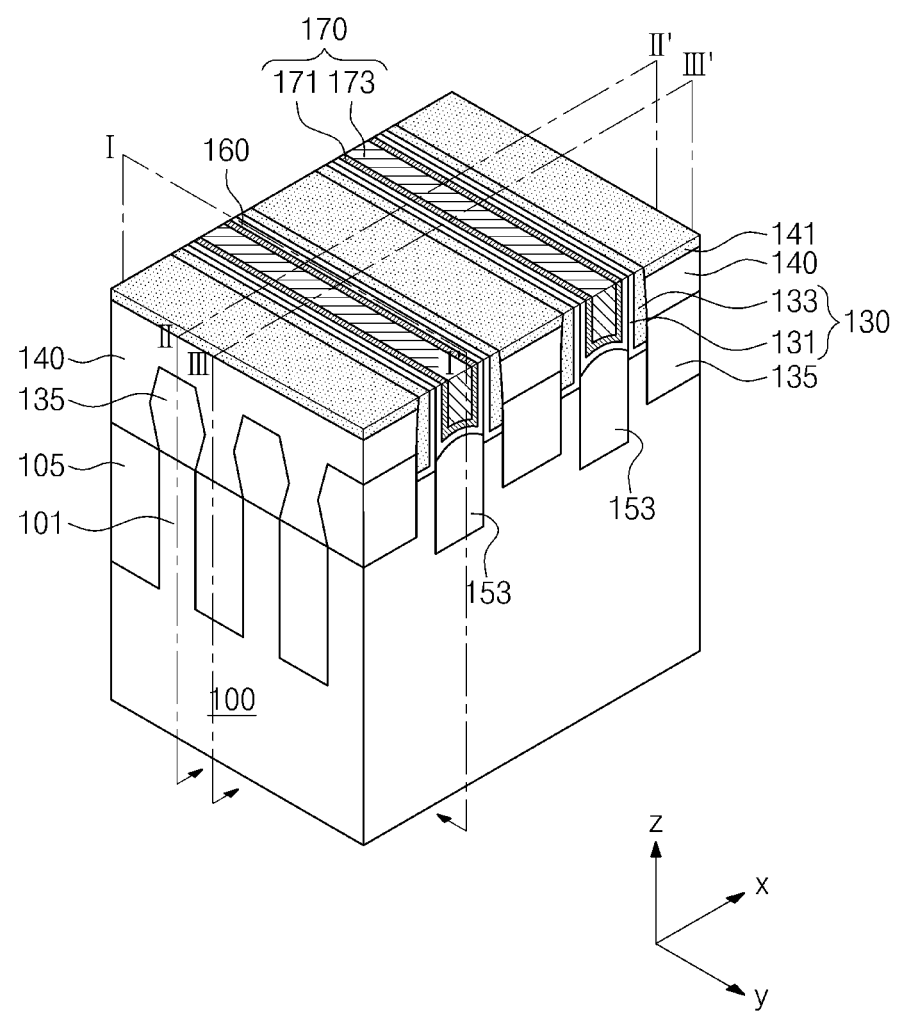
Figure 13B:
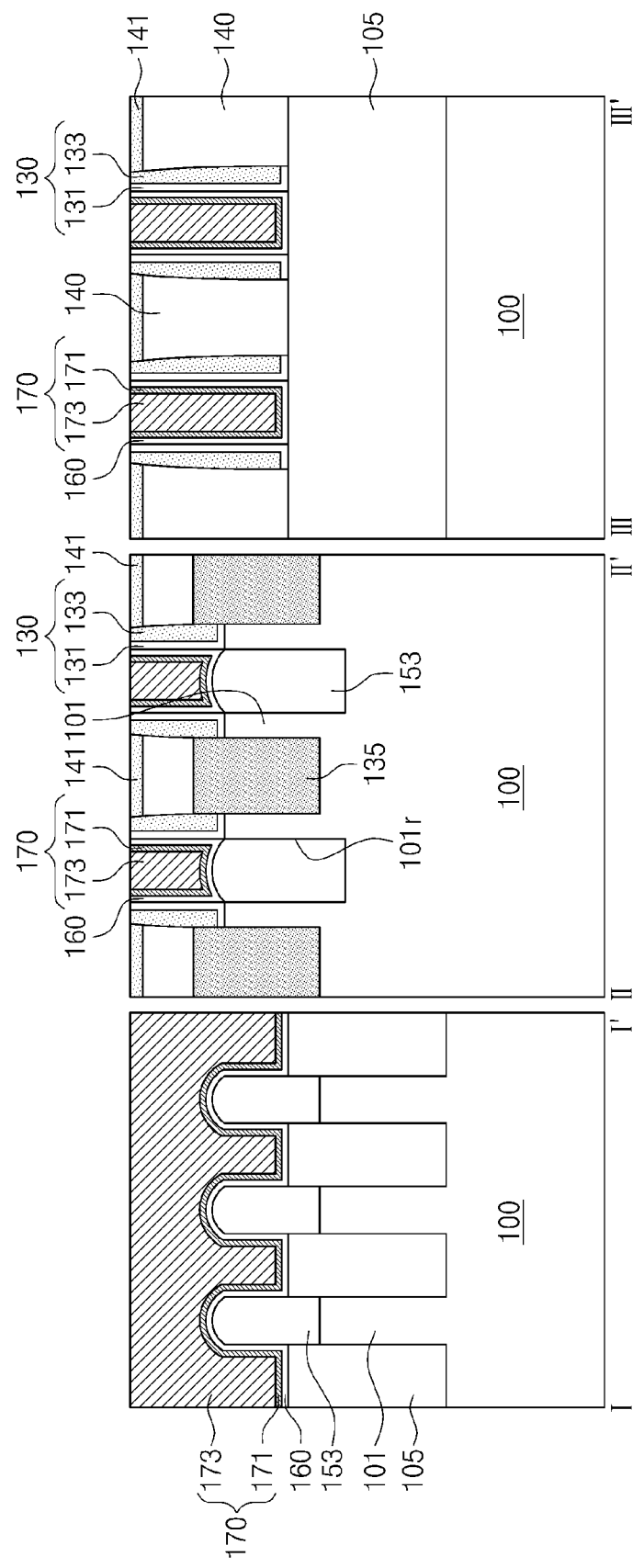
Figure 14:
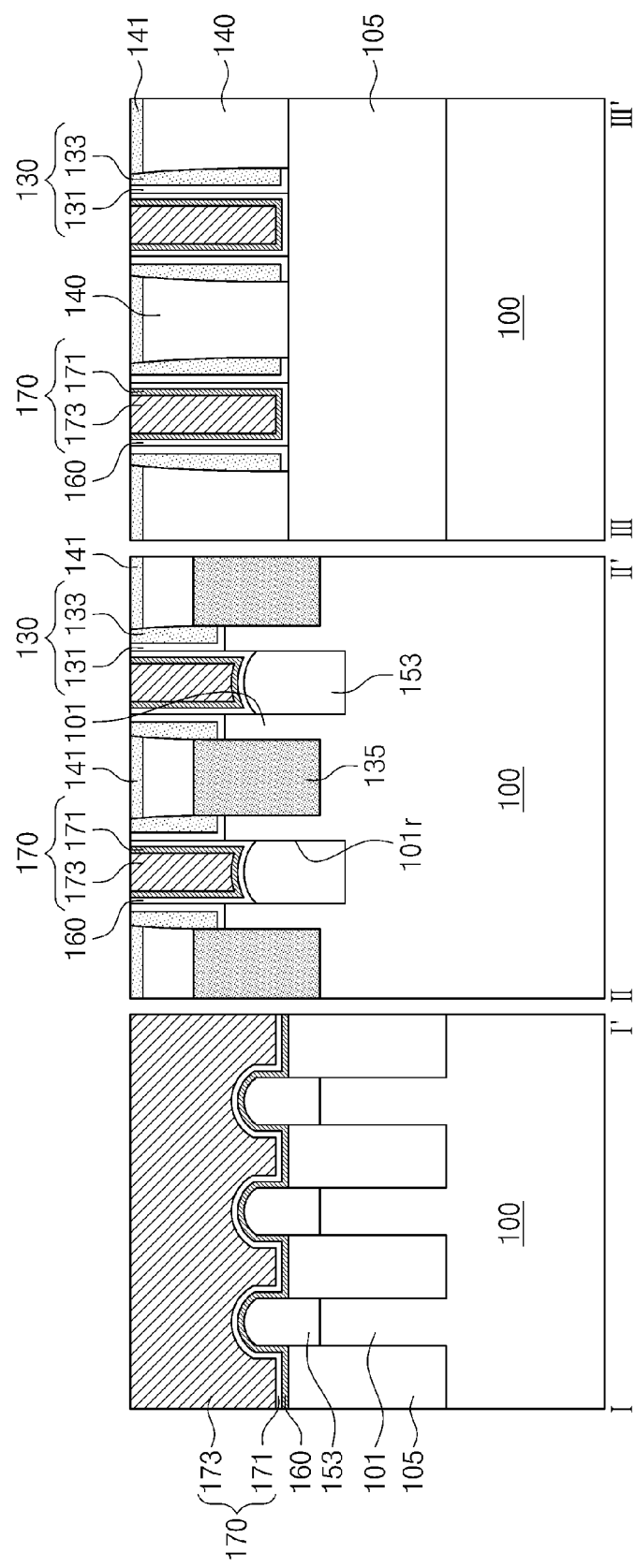
FIG. 14 is a cross-sectional view illustrating a method of manufacturing a semiconductor device according to other embodiments of the inventive concepts.

Referring to FIGS. 1, 13A, and 13B, a gate dielectric layer 160 and a gate electrode 170 are formed to cover the upper surface and the sidewalls of the channel pattern 153 in the gate region (S90).

The gate dielectric layer 160 may be formed of a high-k dielectric layer such as, for example, a hafnium oxide layer, a hafnium silicate layer, a zirconium oxide layer, or a zirconium silicate layer. The gate dielectric layer 160 may be conformally formed on the upper surfaces and sidewalls of the channel patterns 153 by an atomic layer deposition (ALD) technique. Alternatively, the gate dielectric layer 160 may be formed by thermally oxidizing surfaces of the channel patterns 153 exposed through the gate region 145.

In some embodiments, the gate electrode 170 may extend in a direction (e.g., a y-axis direction) crossing over the active patterns 101. The gate electrode 170 disposed on the upper surface of the device isolation layer 105 may be thicker than the gate electrode 170 disposed on the upper surface of the channel pattern 153. The gate electrode 170 may include a barrier metal pattern 171 and a metal pattern 173 that are sequentially stacked. In some embodiments, the barrier metal pattern 171 may be formed of a conductive material having a predetermined work function. In some embodiments, the barrier metal pattern 171 may be formed of at least one of metal nitrides such as titanium nitride, tantalum nitride, tungsten nitride, hafnium nitride, and zirconium nitride. The metal pattern 173 may be formed of at least one of conductive materials having a resistivity lower than that of the barrier metal pattern 171. For example, the metal pattern 173 may be formed of at least one of tungsten, copper, hafnium, zirconium, titanium, tantalum, aluminum, ruthenium, palladium, platinum, cobalt, nickel, or conductive metal nitrides.

In some embodiments, a barrier metal layer and a metal layer may be sequentially deposited in the gate region 145 having the gate dielectric layer 160, and the deposited metal layer and barrier metal layer may be then planarized until the upper surface of the interlayer insulating layer 140 is exposed, thereby forming the gate electrode 170. Each of the barrier metal layer and the metal layer may be formed, for example, using a CVD technique, a PVD technique, or an ALD technique. The barrier metal layer may be formed to conformally cover an inner surface of the gate region 145. As such, the barrier metal layer may be formed to have a substantially uniform thickness on the gate dielectric layer 160 exposed through the gate region 145. The planarization process of the barrier metal layer and the metal layer may be performed using, for example, a blanket anisotropic etching process (e.g., an etch-back process) and/or a chemical mechanical polishing (CMP) process.

Figure 17:
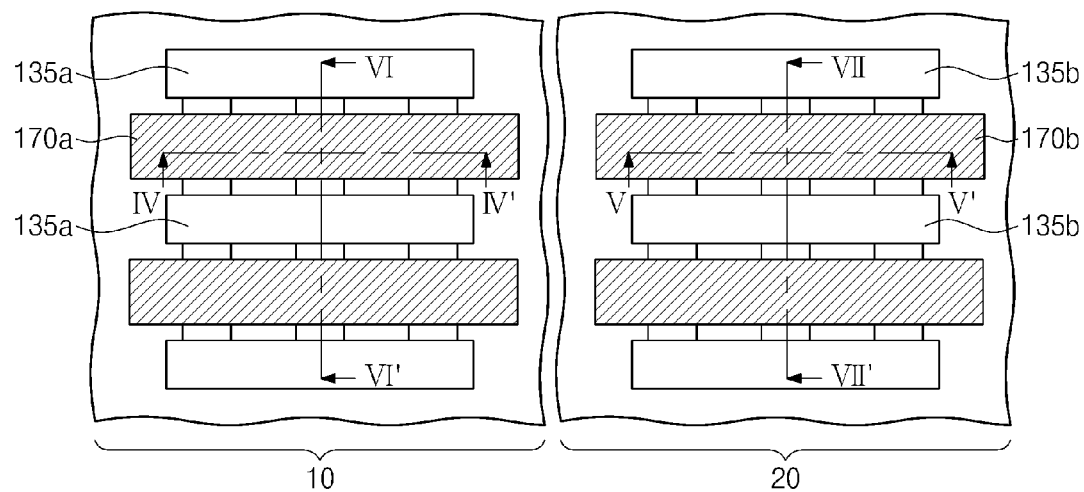
FIG. 17 is a plan view illustrating a semiconductor device according to still other embodiments of the inventive concepts.
Figure 18:
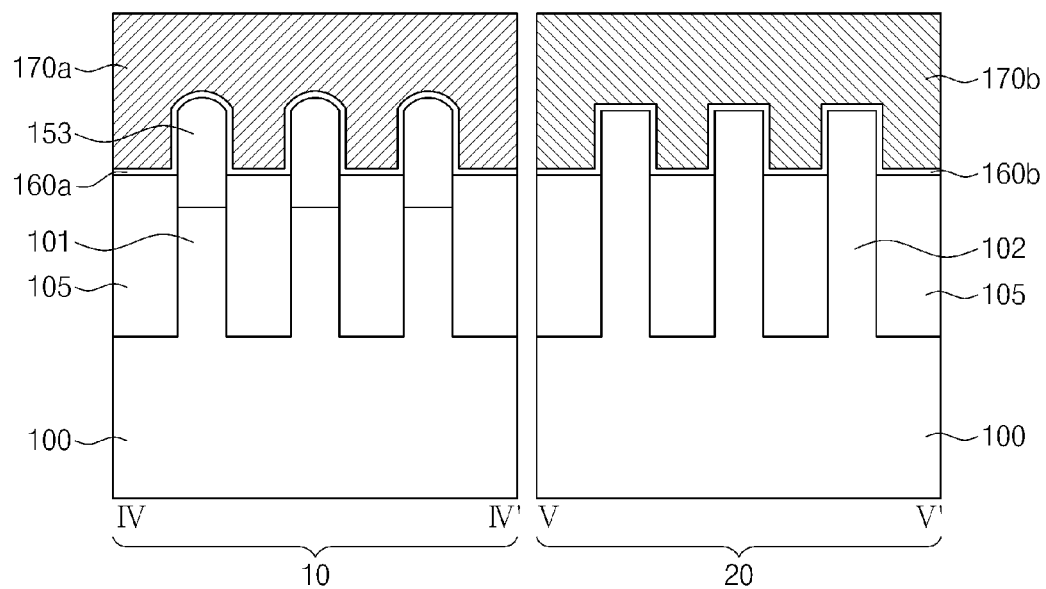
FIG. 18 is a cross-sectional view taken along lines IV-IV' and V-V' of FIG. 17 to illustrate a semiconductor device according to still other embodiments of the inventive concepts.
Figure 19:
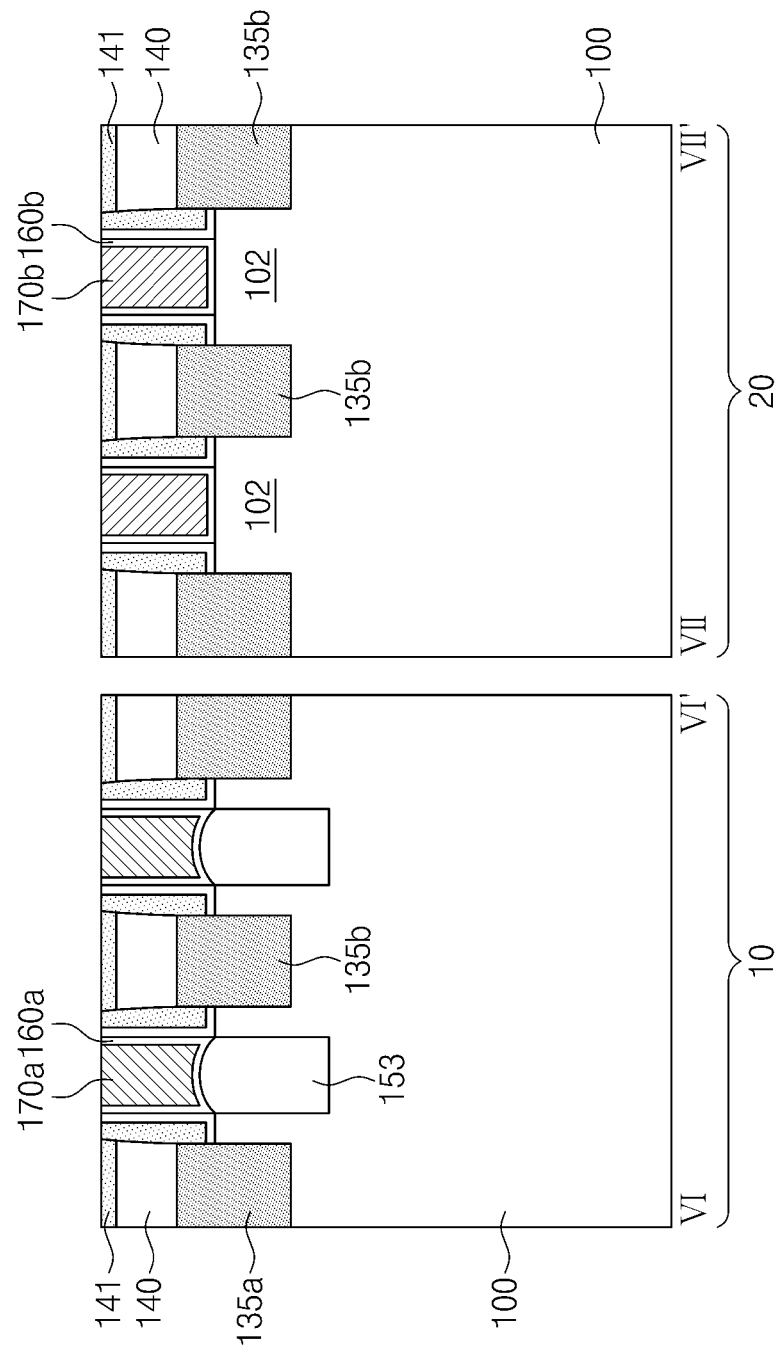
FIG. 19 is a cross-sectional view taken along lines VI-VI' and VII-VII' of FIG. 17 to illustrate a semiconductor device according to still other embodiments of the inventive concepts.

FIG. 17 is a plan view illustrating a semiconductor device according to still other embodiments of the inventive concepts. FIG. 18 is a cross-sectional view taken along lines IV-IV' and V-V' of FIG. 17 to illustrate a semiconductor device according to still other embodiments of the inventive concepts. FIG. 19 is a cross-sectional view taken along lines VI-VI' and VII-VII' of FIG. 17 to illustrate a semiconductor device according to still other embodiments of the inventive concepts.

Referring to FIGS. 17, 18, and 19, a semiconductor substrate 100 may include a first region 10 and a second region 20. In some embodiments, a PMOS field effect transistor may be formed in the first region 10, and an NMOS field effect transistor may be formed in the second region 20.

First active patterns 101 may protrude from the semiconductor substrate 100 of the first region 10, and second active patterns 102 may protrude from the semiconductor substrate 100 of the second region 20. The first and second active patterns 101 and 102 may have bar shapes extending in one direction. A device isolation layer 105 may be disposed between the first and second active patterns 101 and 102. In this embodiment, upper surfaces of the first active patterns 101 may be lower than upper surfaces of the second active patterns 102. In addition, the upper surfaces of the first active patterns 101 may be lower than the upper surface of the device isolation layer 105. The upper surfaces of the second active patterns 102 may be higher than the upper surface of the device isolation layer 105.

A first gate electrode 170a may be disposed to cross over the first active patterns 101 in the first region 10, and a second gate electrode 170b may be disposed to cross over the second active patterns 102 in the second region 20. In one embodiment, the first and second gate electrodes 170a and 170b may include metal materials having work functions different from each other.

In one embodiment, a channel pattern 153 may be locally disposed between the first gate electrode 170a and the first active pattern 101. The channel pattern 153 may have a lattice constant different from that of the first active pattern 101. In this embodiment, as described above, a portion of the first active pattern 101 between source/drain regions may be etched to form the channel recess region before the formation of the first gate electrode 170a and then the channel pattern 153 may be formed using the selective epitaxial growth (SEG) process in the channel recess region. In some embodiments, upper surfaces of the channel patterns 153 may be disposed at a substantially same level as the upper surfaces of the second active patterns 102.

A first gate dielectric layer 160a may be conformally formed on the upper surface and sidewalls of the channel pattern 153, and a second gate dielectric layer 160a may be conformally formed on the upper surface and sidewalls of the second active pattern 102. The first gate electrode 170a may be disposed on the first gate dielectric layer 160a, and the second gate electrode 170b may be disposed on the second gate dielectric layer 160b.

In addition, first source/drain electrodes 135a may be formed at both sides of the first gate electrode 170a, and second source/drain electrodes 135b may be disposed at both sides of the second gate electrode 170b.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory.

A chip or package that includes the semiconductor devices, such as the fin structures described above, may also be referred to generally as a semiconductor device.

Figure 20:
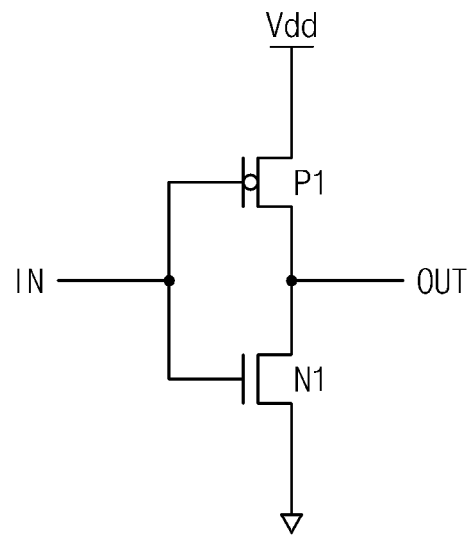
FIG. 20 is a circuit diagram illustrating an inverter including a semiconductor device according to embodiments of the inventive concepts.

FIG. 20 is a circuit diagram illustrating an inverter including a semiconductor device according to embodiments of the inventive concepts.

Referring to FIG. 20, a CMOS inverter consists of a PMOS transistor P1 and an NMOS transistor N1. The PMOS and NMOS transistors P1 and N1 may be connected in series between a driving voltage Vdd and a ground voltage (Vss). An input signal IN is inputted in common to gates of the PMOS and NMOS transistors P1 and N1, and an output signal OUT is outputted in common from drains of the PMOS and NMOS transistors P1 and N1. The driving voltage Vdd is applied to a source of the PMOS transistor P1, and the ground voltage (Vss) is applied to a source of the NMOS transistor N1. This CMOS inverter inverts the input signal IN to output the output signal OUT. For example, if the input signal In of the inverter is a logic level '1', the output signal OUT of a logic level '0' is outputted. On the other hand, if the input signal In of the inverter is a logic level '0', the output signal OUT of a logic level '1' is outputted. The PMOS transistor P1 may be the PMOS field effect transistor of FIGS. 17 to 19, and the NMOS transistor N1 may be the NMOS field effect transistor of FIGS. 17 to 19.

Figure 21:
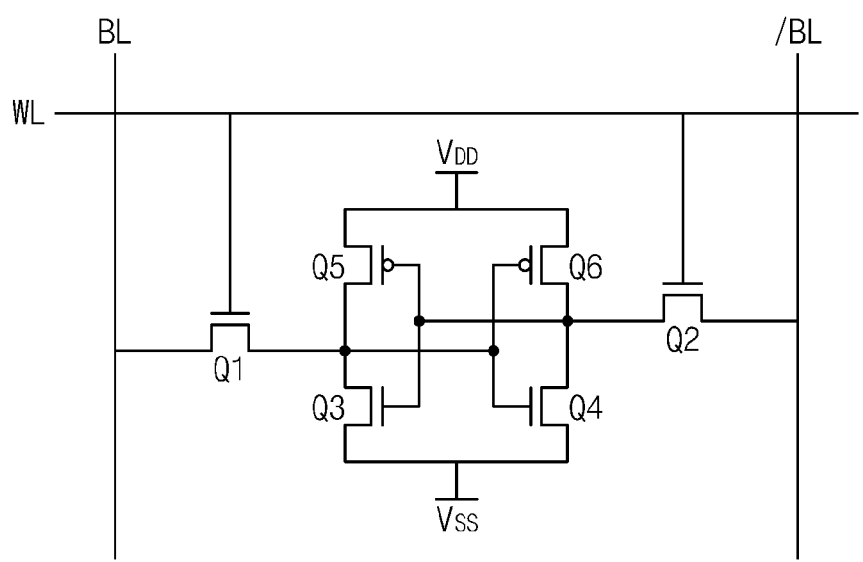
FIG. 21 is a circuit diagram illustrating a static random access memory (SRAM) device including a semiconductor device according to embodiments of the inventive concepts.

FIG. 21 is a circuit diagram illustrating a static random access memory (SRAM) device including a semiconductor device according to embodiments of the inventive concepts.

Referring to FIG. 21, in a SRAM device, one cell consists of first and second access transistors Q1 and Q2, first and second drive transistors Q3 and Q4, and first and second load transistors Q5 and Q6. Sources of the first and second drive (pull-up) transistors Q3 and Q4 are connected to a ground line Vss, and sources of the first and second load transistors Q5 and Q6 are connected to a power line $V_{DD}$.

The first drive transistor Q3 corresponding to an NMOS transistor and the first load transistor Q5 corresponding to a PMOS transistor may constitute a first inverter, and the second drive transistor Q4 corresponding to an NMOS transistor and the second load transistor Q6 corresponding to a PMOS transistor may constitute a second inverter.

Output terminals of the first and second inverters are connected to a source of the first access transistor Q1 and a source of the second access transistor Q2, respectively. To form a latch circuit, an input terminal of the first inverter is connected to the output terminal of the second inverter and the output terminal of the first inverter is connected to an input terminal of the second inverter. Drains of the first and second access transistors Q1 and Q2 are connected to first and second bit lines BL and /BL, respectively.

FIGS. 22 to 25 are schematic block diagrams illustrating electronic systems including semiconductor devices according to embodiments of the inventive concepts.

An electronic system including the semiconductor device according to embodiments of the inventive concepts may be applied to electronic devices such as a personal digital assistant (PDA), a portable computer, a web tablet, a wireless phone, a mobile phone, a digital music player, a memory card, or other electronic products receiving and/or transmitting information data by wireless.

Figure 22:
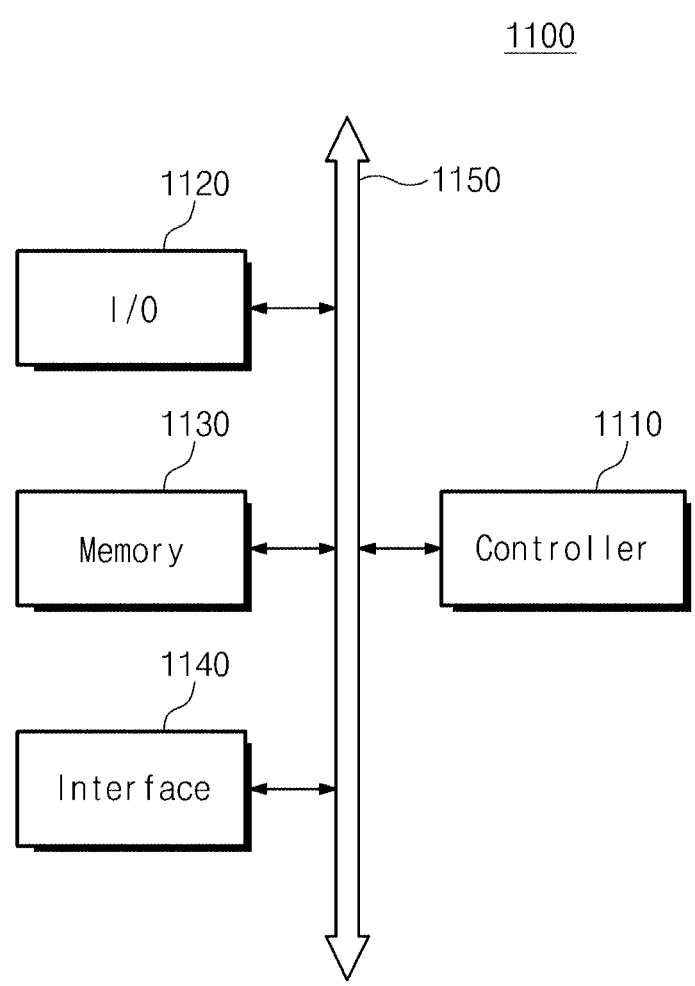
FIGS. 22 to 25 are schematic block diagrams illustrating electronic systems including semiconductor devices according to embodiments of the inventive concepts.

Referring to FIG. 22, an electronic system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include the semiconductor device according to embodiments of the inventive concepts.

The controller 1110 may include at least one of a microprocessor, a digital signal processor, a microcontroller, or another logic device having a similar function to any one thereof. The I/O unit 1120 may include a keypad, a keyboard and/or a display unit.

The memory device 1130 may store data and/or commands. The interface unit 1140 may transmit electrical data to a communication network or may receive electrical data from a communication network.

The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast SRAM device which acts as a cache memory for improving an operation of the controller 1110.

Figure 23:
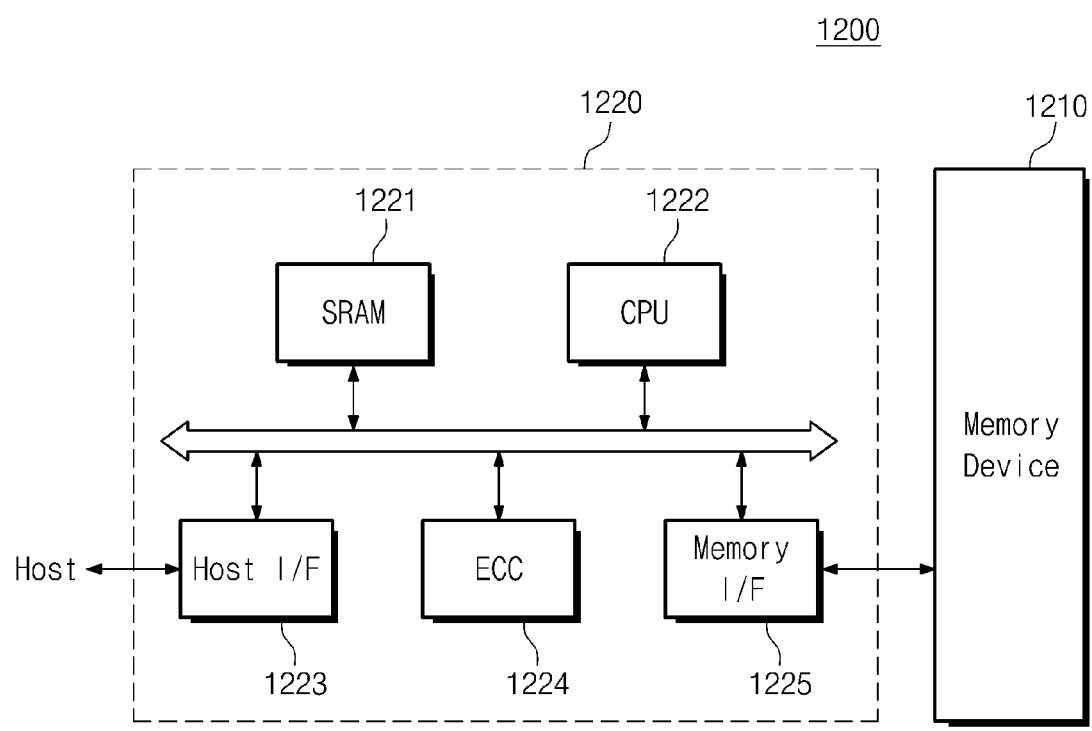

Referring to FIG. 23, an electronic device such as a memory card 1200 for storing high capacity data may include a memory device 1210. The memory card 1200 may further include a memory controller 1220 that controls data communication between a host and the memory device 1210.

An SRAM device 1221 may be used as a working memory of a central processing unit (CPU) 1222. A host interface unit 1223 may be configured to include a data communication protocol between the memory card 1200 and the host. An error correction code (ECC) block 1224 may detect and correct errors of data which are read out from the memory device 1210. A memory interface unit 1225 may interface with the memory device 1210. The CPU 1222 may control overall operations of the memory card 1200. Even though not shown in the drawings, the memory card 1200 may further include a read only memory (ROM) device that stores code data to interface with the host.

Figure 24:
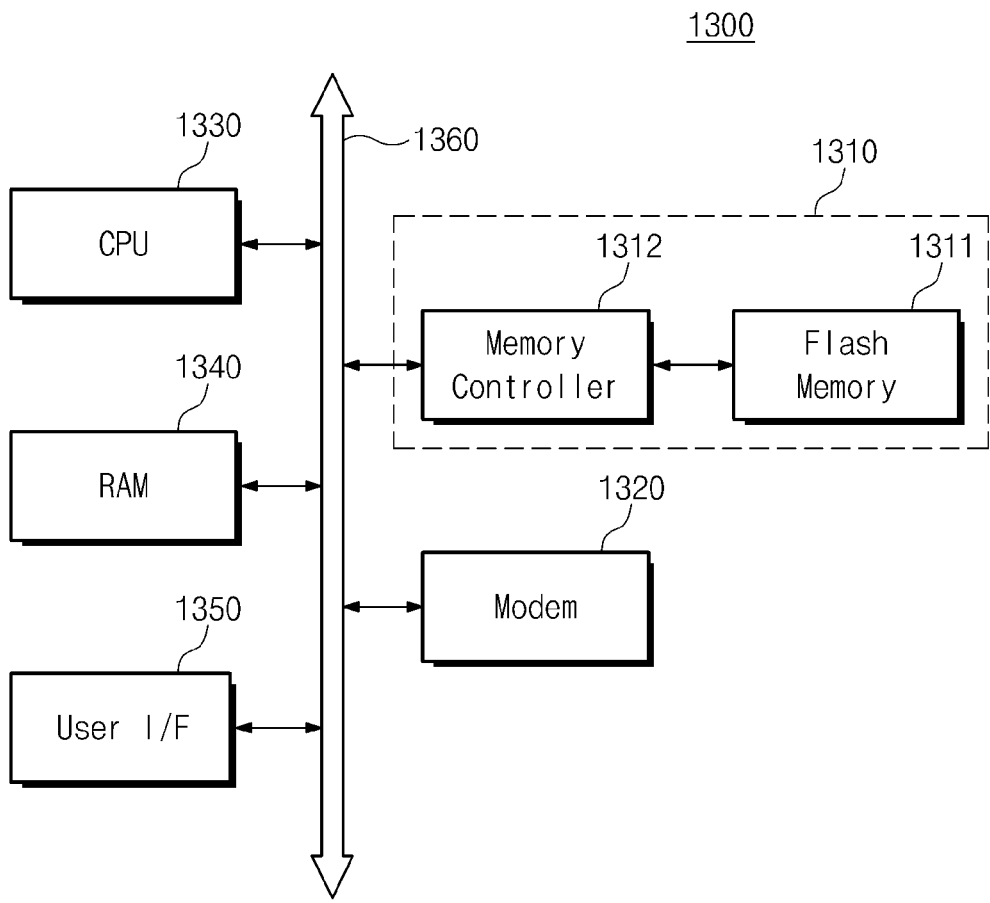

Referring to FIG. 24, at least one of the semiconductor devices according to the aforementioned embodiments may be installed in an electronic system 1300 such as a mobile device or a desk top computer. The electronic system 1300 according to the inventive concepts may include a modem 1320, a central processing unit (CPU) 1330, a random access memory (RAM) 1340 and a user interface unit 1350 that are electrically connected to a memory system 1310 through a system bus 1360. The memory system 1310 may have substantially the same structure as the memory card 1200 described above. The memory system 1310 may store data processed by the CPU 1330 or data inputted from an external system. Here, the memory system 1310 may be realized as a solid state disk (SSD) device. In this case, the electronic system 1300 may stably store massive data in the flash memory system 1310. Additionally, as reliability of the memory system 1310 may increase, the memory system 1310 may reduce a resource consumed for correcting errors to provide a fast data exchange function to the electronic system 1300. Even though not shown in the drawings, an application chipset, a camera image processor (CIS), and an input/output unit may further be provided in the electronic system 1300.

Figure 25:
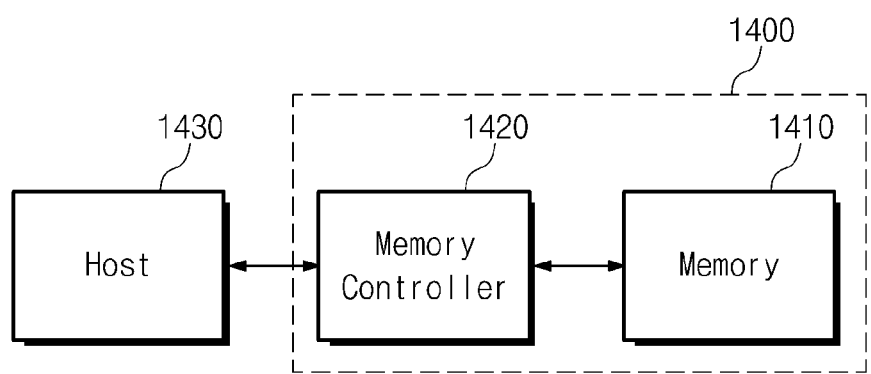

Referring to FIG. 25, the semiconductor device according to embodiments of the inventive concepts may be used to realize a memory system. A memory system 1400 may include a memory device 1410 and a memory controller 1420 for storage massive data. The memory controller 1420 may read data from/store data into the memory device 1410 in response to read/write request of a host 1430. The memory device 1410 may include the semiconductor device according to the aforementioned embodiments of the inventive concepts.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

According to embodiments of the inventive concepts, the channel pattern having the lattice constant different from that of the semiconductor substrate is provided under the gate electrode to increase mobility of charges of the fin field effect transistor. According to embodiments, since the channel pattern is formed after the removal of the dummy gate pattern, it is possible to prevent the channel pattern from being damaged during the process of removing the dummy gate pattern.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
    forming an active pattern on a semiconductor substrate, the active pattern protruding and extending from the semiconductor substrate;
    forming a dummy gate pattern crossing over the active pattern;
    forming gate spacers on opposite first and second sidewalls of the dummy gate pattern;
    forming source and drain electrodes disposed on the active pattern at both sides of the dummy gate pattern;
    removing the dummy gate pattern to form a gate region exposing an upper surface and sidewalls of the active pattern between the gate spacers;
    recessing the upper surface of the active pattern exposed by the gate region to form a channel recess region disposed between the source and drain electrodes;
    forming a channel pattern in the channel recess region by a selective epitaxial growth (SEG) process, the channel pattern having sidewalls and having a lattice constant different from that of the semiconductor substrate; and
    forming a gate dielectric layer and a gate electrode covering an upper surface and the sidewalls of the channel pattern in the gate region.

2. The method of claim 1, further comprising:
    forming a mold pattern covering the sidewalls of the active pattern in the gate region before the formation of the channel recess region, the mold pattern exposing the upper surface of the active pattern in the gate region,
    wherein the mold pattern defines the sidewalls of the channel pattern.

3. The method of claim 2, further comprising:
    removing the mold pattern to expose the sidewalls of the channel pattern before the formation of the gate dielectric layer and the gate electrode.

4. The method of claim 1, further comprising:
    forming a device isolation layer exposing a sidewall of an upper portion of the active pattern before the formation of the dummy gate pattern,
    wherein a recessed upper surface of the active pattern in the channel recess region is lower than an upper surface of the device isolation layer.

5. The method of claim 1, wherein bottom surfaces of the gate spacers are in contact with an upper surface of the active pattern.

6. The method of claim 1, wherein the upper surface of the channel pattern is lower than bottom surfaces of the gate spacers.

7. The method of claim 1, wherein a width of an upper portion of the channel pattern is greater than a width of a lower portion of the channel pattern in contact with the active pattern.

8. The method of claim 1, wherein an upper surface of the semiconductor substrate has a (100) crystal plane, and
    wherein the sidewall of the channel pattern has a (110) crystal plane.

9. The method of claim 1, wherein the forming the source and drain electrodes occurs before the removing the dummy gate pattern.

10. A method of manufacturing a semiconductor device, the method comprising:
    forming an active pattern on a semiconductor substrate, the active pattern protruding and extending from the semiconductor substrate;
    forming source and drain electrodes disposed on the active pattern and spaced apart from each other;
    recessing an upper surface of the active pattern between the source and drain electrodes to form a channel recess region;
    forming a channel pattern in the channel recess region by a selective epitaxial growth (SEG) process, the channel pattern having sidewalls and having a lattice constant different from that of the semiconductor substrate; and
    forming a gate dielectric layer and a gate electrode crossing over the active pattern and covering an upper surface and the sidewalls of the channel pattern,
    wherein the channel pattern is disposed between the source and drain electrodes.

11. The method of claim 10, further comprising:
    forming a dummy gate pattern crossing over the active pattern before the formation of the source and drain regions;
    forming gate spacers on opposite first and second sidewalls of the dummy gate pattern; and
    removing the dummy gate pattern to form a gate region exposing the upper surface and sidewalls of the active pattern between the gate spacers before recessing the upper surface of the active pattern.

12. The method of claim 11, further comprising:
    forming a mold pattern covering the sidewalls of the active pattern in the gate region before the formation of the channel recess region, the mold pattern exposing the upper surface of the active pattern in the gate region,
    wherein the mold pattern defines the sidewall of the channel pattern.

13. The method of claim 12, further comprising removing the mold pattern to expose the sidewall of the channel pattern before the formation of the gate dielectric layer and the gate electrode.

14. The method of claim 12, wherein the gate spacers are disposed between the source and drain regions, and
    wherein the channel pattern is disposed between the gate spacers.

15. The method of claim 11, further comprising:
    forming a device isolation layer exposing a sidewall of an upper portion of the active pattern before the formation of the dummy gate pattern,
    wherein a recessed upper surface of the active pattern in the channel recess region is lower than an upper surface of the device isolation layer.

16. The method of claim 10, wherein the upper surface of the channel pattern is rounded.

17. A method of manufacturing a semiconductor device, the method comprising:
- patterning a semiconductor substrate to form active patterns extending from the semiconductor substrate;
- forming a dummy gate pattern crossing over the active patterns;
- forming gate spacers on both sidewalls of the dummy gate pattern;
- forming source and drain electrodes disposed on the active pattern at both sides of the dummy gate pattern;
- removing the dummy gate pattern to form a gate region exposing upper surfaces and sidewalls of the active patterns between the gate spacers;
- forming a mold pattern filling a space between the active patterns in the gate region, the mold pattern exposing the upper surfaces of the active patterns in the gate region;
- recessing the upper surfaces of the active patterns exposed by the mold pattern to form a channel recess region exposing a sidewall of the mold pattern in the gate region;
- forming a channel pattern in the channel recess region by a selective epitaxial growth (SEG) process, the channel pattern disposed between the source and drain electrodes and having sidewalls and having a lattice constant different from that of the semiconductor substrate; and
- forming a gate dielectric layer and a gate electrode covering an upper surface and the sidewalls of the channel pattern in the gate region.

18. The method of claim 17, wherein the channel pattern is in contact with the sidewall of the mold pattern when the selective epitaxial growth (SEG) process is performed, and the method further comprising:
- removing the mold pattern to expose the sidewalls of the channel pattern before the formation of the gate dielectric layer and the gate electrode.

19. The method of claim 17, further comprising forming a device isolation layer exposing sidewalls of upper portions of the active patterns before the formation of the dummy gate pattern,
wherein recessed upper surfaces of the active patterns in the channel recess region are lower than an upper surface of the device isolation layer.

20. The method of claim 17, wherein the forming the source and drain electrodes occurs before the removing the dummy gate pattern.

* * * * *